(12) United States Patent
Cocchini et al.

(10) Patent No.: US 12,660,083 B2
(45) Date of Patent: Jun. 16, 2026

(54) VERTICAL CONDUCTIVE STRUCTURE TRANSITION IMPEDANCE OPTIMIZATION

(71) Applicant: International Business Machines Corporation, Armonk, NY (US)

(72) Inventors: Matteo Cocchini, New York, NY (US); Kyle Indukummar Giesen, Pittsboro, NC (US); Egduard Ramon Jauregui, Aurora, CO (US); Hung The Hac Nguyen, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 18/594,640

(22) Filed: Mar. 4, 2024

(65) Prior Publication Data

US 2025/0280493 A1     Sep. 4, 2025

(51) Int. Cl.
H05K 1/02          (2006.01)
H01P 3/08          (2006.01)
(Continued)

(52) U.S. Cl.
CPC ............. H05K 1/0253 (2013.01); H01P 3/08 (2013.01); H05K 1/0222 (2013.01);
(Continued)

(58) Field of Classification Search
CPC .. H05K 1/0251; H05K 1/0222; H05K 1/0245; H05K 2201/09518;
(Continued)

(56) References Cited

U.S. PATENT DOCUMENTS 6,137,064 A     10/2000 Kiani et al.
7,151,420 B2 *  12/2006 Brunker .............. H05K 9/0018
                                                    333/4

(Continued)

FOREIGN PATENT DOCUMENTS

CN      214627485 U     11/2021
CN      114080090 A      2/2022
WO      00/78105 A1     12/2000

OTHER PUBLICATIONS

International Searching Authority, "Notification of Transmittal of the International Search Report and the Written Opinion of the International Searching Authority, or Declaration," Patent Cooperation Treaty Jun. 25, 2025, 17 pages, International Application No.—PCT/EP2025/054531.
(Continued)

*Primary Examiner* — Andrea Lindgren Baltzell
*Assistant Examiner* — Abigail Amir Yaldo
(74) *Attorney, Agent, or Firm* — Daniel M. Yeates

(57)          ABSTRACT

A printed circuit board (PCB), vertical conductive structures (VeCSs) for the PCB, and a method of fabricating a printed circuit board (PCB). The VeCS includes a VeCS slot at least partially defined in a dielectric substrate. A vertical signal trace is positioned on a first side of the VeCS slot and a vertical reference trace is positioned on a second side of the VeCS slot opposite the vertical signal trace. The VeCS has a predetermined impedance. A plurality of signal ground planes is positioned at a respective predetermined distance from the vertical signal trace. Each signal ground plane defines a cutout.

19 Claims, 9 Drawing Sheets

(51) Int. Cl.
　　*H05K 3/00*　　　　(2006.01)
　　*H05K 3/42*　　　　(2006.01)
(52) U.S. Cl.
　　CPC ......... *H05K 1/0245* (2013.01); *H05K 1/0251*
　　　　(2013.01); *H05K 3/0044* (2013.01); *H05K*
　　　　*3/429* (2013.01); *H05K 2201/09518* (2013.01);
　　　　　　　　　　*H05K 2201/0959* (2013.01)
(58) Field of Classification Search
　　CPC ......... H05K 2201/0959; H05K 3/0044; H05K
　　　　　　　　　　3/429; H01P 3/08
　　USPC ........................................................ 333/238
　　See application file for complete search history.

(56)　　　　　　　References Cited

U.S. PATENT DOCUMENTS

| | | | |
|---|---|---|---|
| 9,603,255 | B2 | 3/2017 | Tourne |
| 10,368,446 | B2 | 7/2019 | Tourne |
| 11,357,105 | B2 | 6/2022 | Tourne |
| 2007/0033457 | A1 | 2/2007 | Park et al. |
| 2007/0137891 | A1 | 6/2007 | Fan et al. |
| 2018/0054892 | A1 | 2/2018 | Tourne |

OTHER PUBLICATIONS

Cadence PCB Solutions. Vertical Conductive Structures (VeCS) for PCB HD Trace Routing. Retrieved from https://resources.pcb.cadence.com/blog/2020-vertical-conductive-structures-vecs-for-pcb-hd-trace-routing <Retrieved Feb. 5, 2024>.

Cohen, Z. (2020). How 3D Printing PCBs Aids Impedance Controlled Routing. Retrieved from https://www.nano-di.com/resources/blog/2020-how-3d-printing-pcbs-aids-impedance-controlled-routing Mar. 10, 2020.

Holden, H. (2020) "Competition for HDI: VeCS," Created Mar. 4, 2019, updated Jul. 28, 2020. https://resources.altium.com/p/competition-hdi-vecs <Retrieved Feb. 5, 2024.

Holden, H. (2020). Revisiting Vertical Connection Structures-VECS Part 2. https://resources.altium.com/p/revisiting-vertical-connection-structures-vecs-part-2 <Retrieved Feb. 5, 2024> 4 pgs.

Nextgin Technology. "VeCS Principles," https://www.nextgin-tech.com/innovation-areas/vecs/vecs-principles/ <Retrieved on Oct. 27, 2023>.

Nextgin Technology. Vertical Conductive Structure—A New Interconnect Technology. https://www.nextgin-tech.com/innovation-areas/vecs/ <Retrieved Feb. 5, 2024>.

Starkey, P. (2017) Vertical Conductive Structures—a New Dimension in High-Density Printed Circuit Interconnect. https://iconnect007.com/index.php/article/102940/vertical-conductive-structuresa-new-dimension-in-high-density-printed-circuit-interconnect/102943 <Retrieved Feb. 5, 2024>.

Tourne, J. (2018) Vertical Conductive Structure, NextGIn Technology BV. https://www.nextgin-tech.com/cms_file.php?fromDB=369 &forceDownload <Retrieved Feb. 5, 2024>.

Tourne, J. (2019) Vertical Conductive Structures, Part 1: Rethinking Sequential Lamination, PCB007 Magazine, Apr. 2019. pp. 88-93.

Tourne, J. et al. (2017) Transparent Stitching with VeCS-2 (Application note—Draft Version), NextGIn Technology BV, Apr. 2017. 11 pgs.

* cited by examiner

VERTICAL CONDUCTIVE STRUCTURE TRANSITION IMPEDANCE OPTIMIZATION

BACKGROUND

The present disclosure relates to printed circuit boards (PCBs), and more specifically, to enhancing alternatives to vias for vertical connections within the PCBs.

Some known PCBs use vias to implement vertical connections between layers of the respective PCBs. In contrast, some known PCBs use vertical conductive structures (VeCSs) in lieu of vias.

SUMMARY

Vertical conductive structures (VeCSs) for printed circuit boards (PCBs), a PCB, and a method of fabricating a PCB are provided.

In one aspect, a vertical conductive structure (VeCS) for a printed circuit board (PCB) is presented. The VeCS includes a VeCS slot at least partially defined in a dielectric substrate. The VeCS also includes a vertical signal trace positioned on a first side of the VeCS slot. The VeCS further includes a vertical reference trace positioned on a second side of the VeCS slot opposite the vertical signal trace.

In another aspect, a vertical conductive structure (VeCS) for a printed circuit board (PCB) is presented. The VeCS includes a VeCS slot at least partially defined in a dielectric substrate. The VeCS also includes a vertical signal trace positioned on a first side of the VeCS slot. The VeCS further includes a vertical reference trace positioned on a second side of the VeCS slot opposite the vertical signal trace, wherein the VeCS has a predetermined impedance.

In yet another aspect, a vertical conductive structure (VeCS) for a printed circuit board (PCB) is presented. The VeCS includes a VeCS slot at least partially defined in a dielectric substrate. The VeCS also includes a vertical signal trace positioned within the VeCS slot. The VeCS further includes a plurality of signal ground planes. Each signal ground plane of the plurality of signal ground planes is positioned at a respective predetermined distance from the vertical signal trace. Each signal ground plane of the plurality of signal ground planes defines a cutout.

In yet another aspect, a printed circuit board (PCB) is presented. The PCB includes a plurality of vertical conductive structures (VeCSs). One or more VeCSs of the plurality of VeCSs includes a VeCS slot at least partially defined in a dielectric substrate. The one or more VeCSs also include a vertical signal trace positioned on a first side of the VeCS slot. The one or more VeCSs further include a vertical reference trace positioned on a second side of the VeCS slot opposite the vertical signal trace.

In yet another aspect, a method of fabricating a printed circuit board (PCB) is presented. The method includes fabricating an impedance-controlled vertical conductive structure (VeCS). The method also includes forming a VeCS slot in a dielectric substrate. The VeCS slot defines a first side of the VeCS slot and an opposing second side of the VeCS slot. The method further includes positioning a vertical signal trace on the first side of the VeCS slot. The method further includes positioning a vertical reference trace on the second side of the VeCS slot. The VeCS has a predetermined impedance.

The present Summary is not intended to illustrate each aspect of, every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1A:
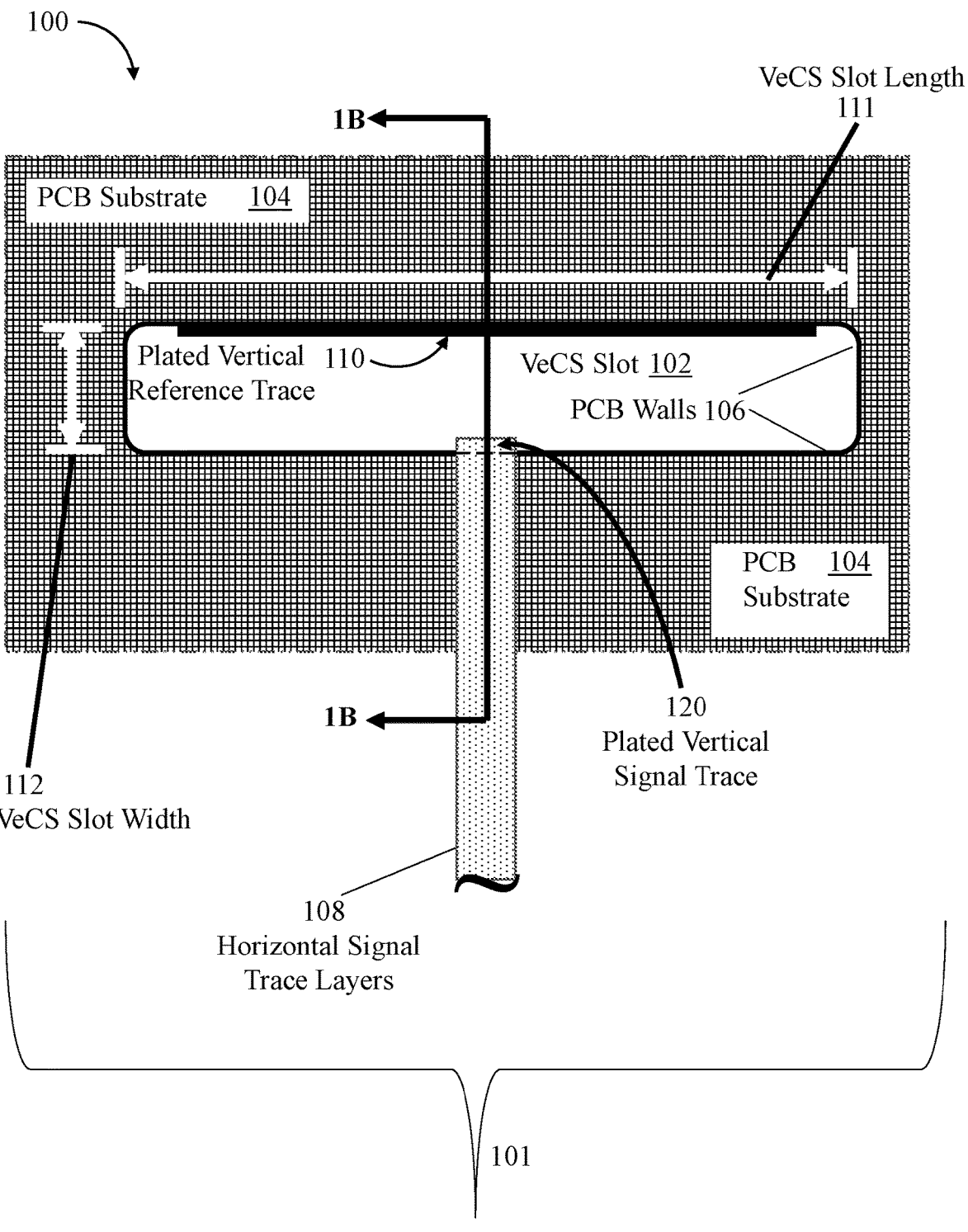
FIG. 1A is a schematic diagram illustrating an overhead view of a single-ended vertical conductive structure, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to implementing enhanced vertical conductive structures (VeCSs) in lieu of vias within printed circuit boards (PCBs). While the present disclosure is not necessarily limited to such applications, various aspects of the disclosure may be appreciated through a discussion of various examples using this context.

It will be readily understood that the components of the present embodiments, as generally described and illustrated in the Figures herein, may be arranged and designed in a wide variety of different configurations. Thus, the following details description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Some known printed circuit boards (PCBs) use vias to implement vertical connections between layers of the respective PCBs. Vias extend vertically between the layers of multilayered PCBs to provide electrical conductivity between the various layers while reducing the overall size of the respective PCB and/or increasing the amount of the PCB available for the respective semiconductor components. Therefore, the vias are used to transition signals between the respective layers through which they extend. Many of such vias have diameters that are within a range extending between approximately 0.2 millimeters (mm) and approximately 0.6 mm, or in non-metric units, approximately 8 thousandths of an inch (mils) and approximately 24 mils, respectively.

Some of the vias are blind vias that are drilled to connect outer layers of a PCB to the inner layers, and not penetrate the entire board. Also, some of the vias are buried vias that are drilled to connect the inner layers of the PCB without reaching any of the outer layers. Furthermore, some of the vias extend through holes that are drilled to extend through every single layer of the board. At least some of the vias are configured as microvias that have diameters that are within a range extending between approximately 0.15 millimeters (mm) and approximately 0.025 mm, or in non-metric units, approximately 6 mils and approximately 1 mil, respectively. Microvias facilitate further reducing the overall size of the PCBs and/or increasing the amount of PCB available for the semiconductor components. In addition, microvias facilitate circuit reliability and radio-frequency (RF) line termination with the associated impedance control. As the number of layers that the vias need to vertically traverse increases, the diameter of the drill bit increases.

In contrast, some known PCBs use vertical conductive structures (VeCSs) in lieu of vias and microvias to transition the respective signals through the respective layers of the PCB. Many of the known VeCSs form multiple vertical connections configured as a plurality of successive flat vertical copper-plated signal traces that are configured to interconnect with the respective points on the PCB. For purposes of this disclosure, the term "trace" is used to identify some combination of electrically-conducting components and associated insulating materials that define a portion of a PCB. It is typically a conductive circuit that is used to connect the various components on the PCB. Some traces in VeCSs are signal traces and some are reference traces (both described further herein).

In some known VeCS configurations, alternating between the vertical copper-plated signal traces are slots configured to maintain separation between the copper traces within the PCB. The flat vertical copper-plated traces may be closer than approximately 0.1 mm (approximately 4 mils) side-to-side. The ends of the VeCS are semi-cylindrical vertical copper-plated signal traces that have a height similar to that of the flat vertical copper-plated signal traces; however, the semi-cylindrical vertical copper-plated signal traces are configured to interconnect with other portions of a reference plane (discussed further below). The flat vertical copper-plated signal traces and the semi-cylindrical vertical copper-plated signal traces define a slot that in some instances is approximately 0.3 mm (approximately 12 mils) in length. The VeCSs are manufactured through standard PCB manufacturing techniques and use the same materials as that used for vias.

For purposes of this disclosure, the term "reference plane" refers to at least a portion of a ground return path for the respective signals. In some embodiments, the reference plane is referred to as the ground plane. In general, many known PCBs include a signal trace and a metallic structure in the form of a plane layer with a layer of dielectric between them. The plane layer is referred to as the reference plane and is typically maintained at ground potential. A high-quality return path with a relatively low impedance that effectively transmits the signals to ground facilitates increasing the signal speeds of the respective circuit with lower noise levels as compared to lower quality reference planes. Moreover, a high-quality reference plane mitigates a potential for errant signals interfering with other traces and inducing antenna-like behavior in portions of the PCB that increases noise levels on the PCB.

In many known configurations, the VeCS includes multiple signal traces in the form of the successive flat vertical copper-plated traces and two semi-cylindrical vertical copper-plated traces that are electrically coupled to their respective reference planes. The previously described slots are configured to maintain separation between each of the signal traces and each of the reference planes. In some known VeCS configurations, the reference plane includes rounded, or semi-cylindrical end segments electrically coupled to a planar segment.

The VeCS offers benefits over the vias, including the microvias. For example, the vertical traces of the VeCS do not require a drilled hole and will take up less space than the traditional vias. More specifically, every drilling operation through a PCB substrate requires that a minimum hole-to-hole spacing be observed, and a large number of drilled holes can consume a significant portion of the PCB. Therefore, with a single VeCS, a significant number of otherwise drilled holes are eliminated and the routing and interconnect density in the PCB may be increased. The profile of the vertical signal traces in the VeCS more closely resemble that of a standard signal trace than does a drilled hole for the vias, and as such, the inductance of the interconnections is decreased from that of the vias. In addition, the vertical signal traces of the VeCS have a slightly better signal-to-reference plane ratio over that of the vias that facilitates the improvement of the overall signal integrity of the PCB. For purposes of this disclosure, the term signal integrity refers to the electrical performance of the physical structures used to transmit signals within an electronic product.

However, many of the known VeCSs are not fully adaptable for use with those PCBs manufactured for modern Peripheral Component Interconnect Express (PCIe) above version 4.0, i.e., PCIe 5.0 and 6.0. More specifically, such known VeCSs display decreasing performance for signal speeds (sometimes referred to as transfer rates) in excess of 16.0 gigatransfers per second (GT/s) per lane associated with PCIe 4.0. GT/s refers to the rate of bit transfer (0 s and 1 s) per second that is transmitted from a first point to a second point.

One reason for the signal speeds, and the resultant signal integrity decreasing with signal speeds, is the rounded portions of the VeCSs that define the semi-cylindrical reference traces. Such rounded portions generate deleterious reflections at such higher signal speeds. For purposes of this disclosure, signal reflection refers to at least a portion of the signals transiting through the rounded portions of the VeCS bouncing back toward the respective source. Such signal reflections are at least partially due to an impedance mismatch between the rounded portions of the VeCS and the remainder of the reference plane. The degradation of the signal integrity due to the reflections is at least partially due to the resultant distortion and ringing in the received signal. The distortion and ringing in turn leads to bit errors and/or erroneous interpretations of the respective data by the receiver. This results in a decrease in the overall signal integrity and the performance of the PCB.

Accordingly, signal reflection in the VeCSs in high-speed PCB data circuits deleteriously affects signal integrity in PCBs at least partially due to improper impedance matching between the rounded portions of the reference plane integrally positioned within the VeCSs and the adjoining planar portions of the reference plane.

Referring to FIG. 1A, a schematic diagram is presented illustrating an overhead view of a single-ended vertical conductive structure 100, herein referred to as the single-ended VeCS 100, in accordance with some embodiments of the present disclosure. In general, a single-ended signal configuration includes a single trace that extends from a source to a routed destination to transition the respective signals. The single-ended signal configuration is the most cost-efficient option to implement because fewer wires are required for transmitting multiple signals. Therefore, since the single-ended VeCS configuration is a popular configuration, PCBs that use single-ended VeCSs will benefit from the improved performance over that of known vias and microvias. Differential signal configurations are discussed elsewhere herein. The single-ended VeCS 100 is a portion of a larger printed circuit board (PCB) 101.

In one or more embodiments, the single-ended VeCS 100 includes a VeCS slot 102 that is formed in a PCB substrate 104. Generally, the VeCS slot 102 is substantially rectangular. The PCB substrate 104 is fabricated from any dielectric material that enables operation of the single-ended VeCS 100 as described herein. The VeCS slot 102 is defined through one or more PCB walls 106 of the PCB substrate 104. The PCB walls 106 are configured to receive electrically conductive devices (discussed further with respect to FIG. 1B). The single-ended VeCS 100 receives two horizontal signal trace layers 108 (both described further with respect to FIG. 1B). The single-ended VeCS 100 further includes a plated vertical reference trace 110. The horizontal signal trace layers 108 and the plated vertical reference trace 110 are manufactured from electrically conductive materials such as, and without limitation, copper. The VeCS slot length 111 and the VeCS slot width 112 are discussed further herein. The single-ended VeCS 100 includes a plated vertical signal trace 120 that is discussed further with respect to FIG. 1B. The configuration of the single-ended VeCS 100 as taken along the line 1B-1B is discussed further with respect to FIG. 1B.

Figure 1B:
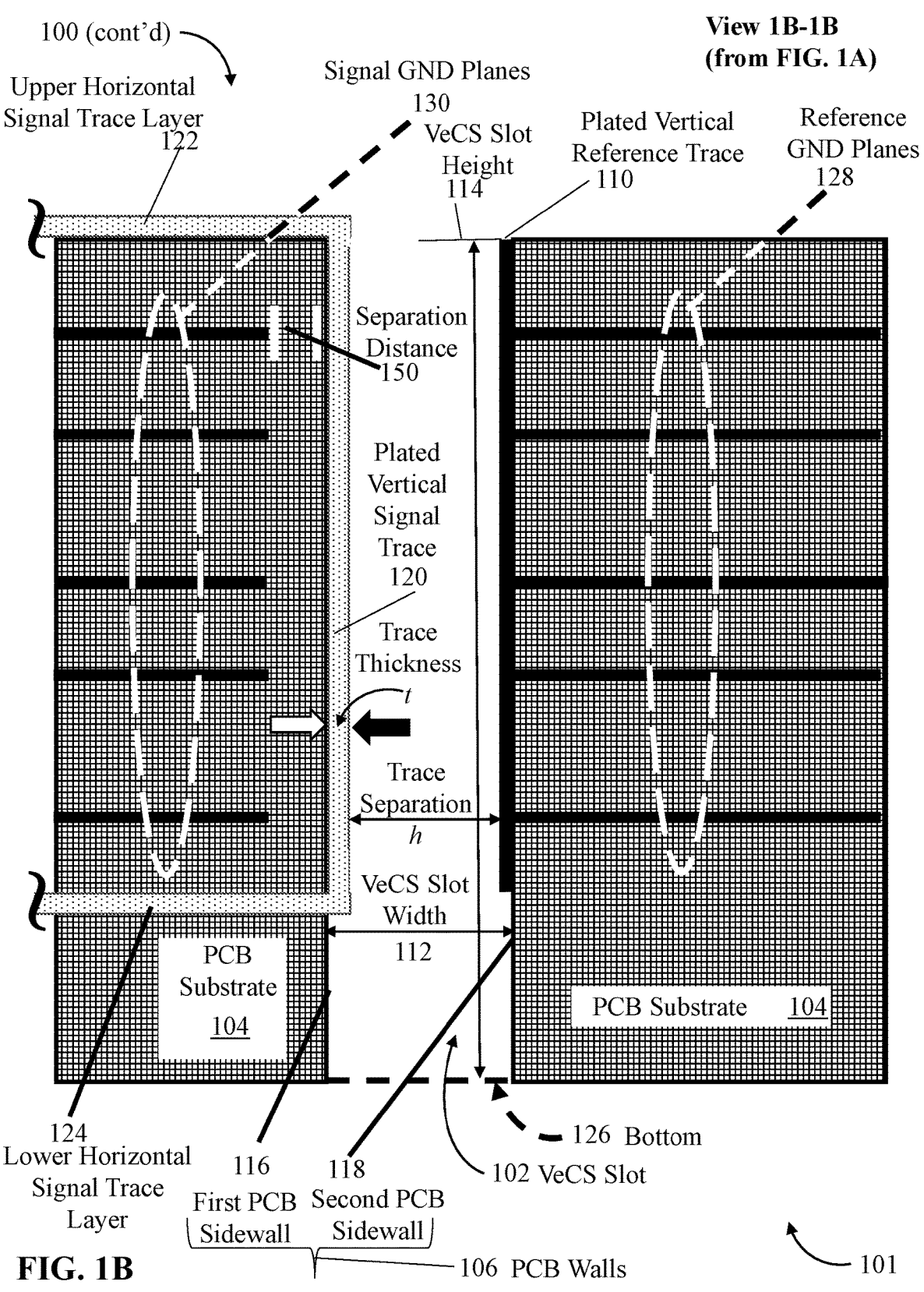
FIG. 1B is a schematic diagram illustrating a side view of the single-ended vertical conductive structure of FIG. 1A, in accordance with some embodiments of the present disclosure.

Referring to FIG. 1B, a schematic diagram is presented illustrating a side view of the single-ended VeCS 100 of FIG. 1A taken along line 1B-1B, in accordance with some embodiments of the present disclosure. The VeCS slot 102 that is formed in the PCB substrate 104 is generally rectangular is shape and defines a VeCS slot height 114 that is configured to extend between two or more layers of the PCB through the PCB substrate 104. The VeCS slot height 114 is at least partially based on the number of layers of the PCB that need to be transitioned by the plated vertical signal trace 120. The VeCS slot width 112 is also shown for reference and is discussed further herein. The PCB walls 106 are configured to receive electrically conductive devices. Specifically, a first side of the VeCS slot 102, i.e., a first PCB sidewall 116 receives the plated vertical signal trace 120 that is electrically coupled to an upper horizontal signal trace layer 122 and a lower horizontal signal trace layer 124 (both shown as horizontal signal trace layers 108 in FIG. 1A). In some embodiments, the upper horizontal signal trace layer 122, the plated vertical signal trace 120, and the lower horizontal signal trace layer 124 define a signal transmission path through the single-ended VeCS 100.

Figure 1C:
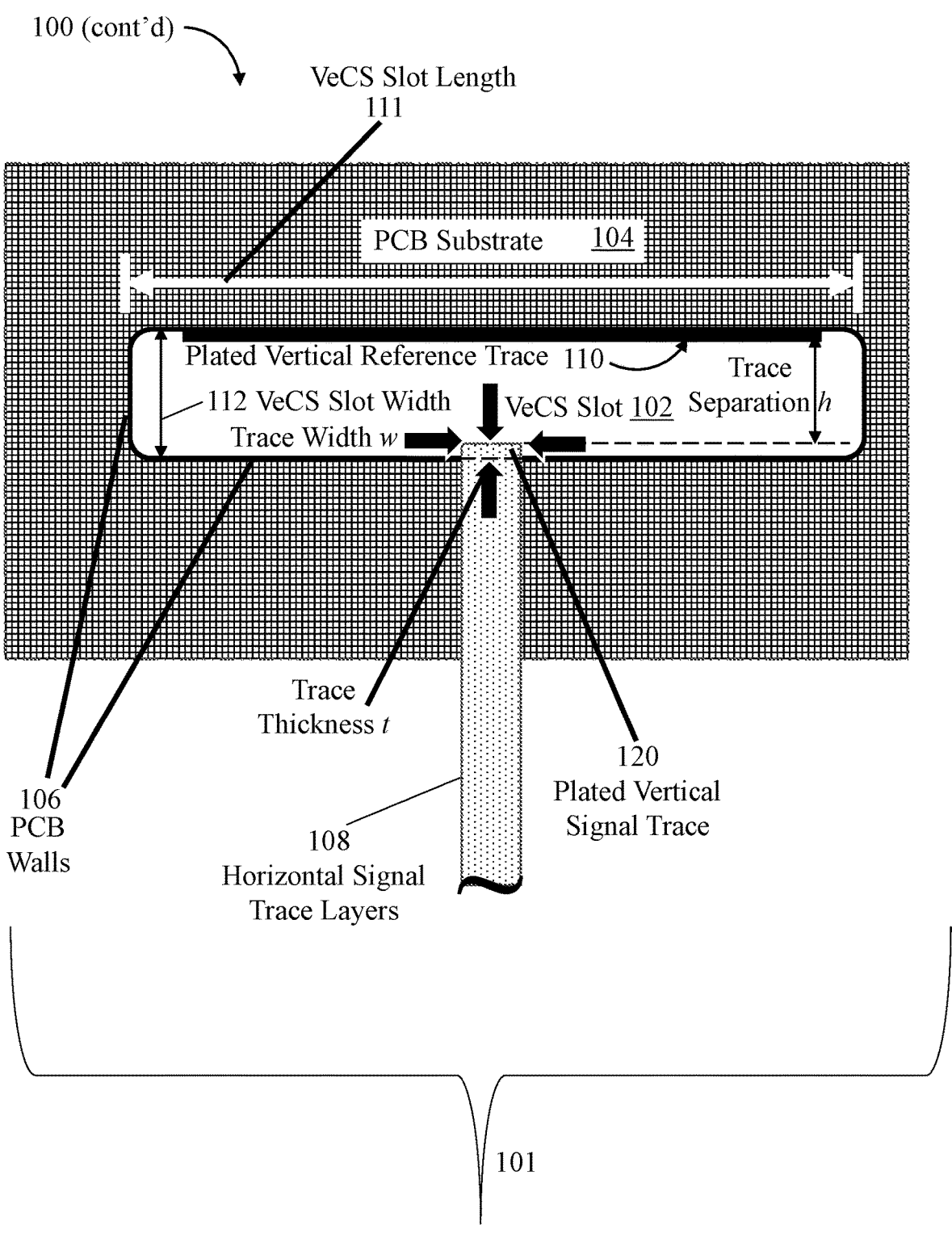
FIG. 1C is a schematic diagram illustrating the overhead view of the single-ended vertical conductive structure of FIGS. 1A and 1B, in accordance with some embodiments of the present disclosure.

The plated vertical signal trace 120 has a plated vertical signal trace thickness t (referred to herein as "the trace thickness t") that is used with respect to FIG. 1C. The trace thickness t is typically expressed in units of mils and millimeters (mm). In some embodiments, the plated vertical reference trace 110 extends to a point proximate a bottom 126 of the VeCS slot 102. The plated vertical signal trace 120 and the plated vertical reference trace 110 define a signal trace-to-reference trace separation distance h (referred to herein as "the trace separation h") within the VeCS slot 102 that is used with respect to the discussion for FIG. 1C. The trace separation h is typically expressed in units of mils and mm.

In at least some embodiments, the plated vertical reference trace 110 is coupled to a second side of the VeCS slot 102, i.e., a second PCB sidewall 118. In addition, the plated vertical reference trace 110 is electrically coupled to a plurality of reference ground (GND) planes 128 such that the plated vertical reference trace 110 creates a short circuit condition, i.e., the plated vertical reference trace 110 is shorted to the reference GND planes 128. In some embodiments, the plated vertical reference trace 110 extends through substantially the same portion of the VeCS slot height 114 opposite the plated vertical signal trace 120 to induce the proper reference voltage. The electrical coupling of the reference GND planes 128 to the plated vertical reference trace 110 facilitates proper grounding of the plated vertical reference trace 110.

In addition, in some embodiments, a plurality of signal GND planes 130 are embedded within the PCB substrate 104 behind the plated vertical signal trace 120. In at least some embodiments, the plated vertical signal trace 120 and each of the signal GND planes 130 are offset from each other by a separation distance 150 (only one shown) to mitigate a potential for electrical discontinuities of the plated vertical signal trace 120 due to a second signal GND plane 130 shorting the plated vertical signal trace 120 to ground. In some embodiments, the separation distance 150 is greater than approximately 100 mils (approximately 2.5 mm) to approximately 120 mils (approximately 3 mm). Accordingly, those signal GND planes 130 that extend towards the plated vertical signal trace 120 are fabricated to only extend to a predetermined distance from the plated vertical signal trace 129, i.e., the separation distance 150.

In some embodiments, the single-ended VeCS 100 defines a microstrip. In general, a standard microstrip is a type of electrical transmission line that includes a conductor embedded in a dielectric that is typically air. In some embodiments, the employment of air in the VeCS slot 102 is economically advantageous as compared to other fills, and is technically simple. The conductor is coupled to a dielectric substrate. The standard microstrip also includes a reference plane that is separated from the conductor by the dielectric substrate. As such, for the standard microstrip, the material sequence is air—conductor—dielectric substrate—reference plane. However, as shown in FIG. 1B, a modified, or a quasi-microstrip vertical configuration includes the plated vertical signal trace 120 (conductor) coupled to the dielectric PCB substrate 104. The plated vertical reference trace 110 (reference plane) is separated from the plated vertical signal trace 120 by the VeCS slot 102 slot that is typically filled with air. As such, the sequence of the modified microstrip is dielectric substrate—conductor—air—reference plane. Therefore, the modified microstrip includes the standard microstrip sequence with the air and the dielectric substrate switched with each other. Accordingly, the single-ended VeCS 100 defines a modified microstrip, and hence, a modified electric transmission line.

The VeCS slot width 112 and the VeCS slot height 114 of the VeCS slot 102 are quantified to facilitate at least partially attaining a desired impedance of approximately 50 Ohms (Ω) for the single-ended VeCS 100, as discussed further herein. Such quantifications are discussed further below.

Referring to FIG. 1C, a schematic diagram is presented illustrating the overhead view of the single-ended VeCS 100 of FIGS. 1A and 1B, in accordance with some embodiments of the present disclosure. The plated vertical signal trace 120 and the plated vertical reference trace 110 define the trace separation h within the VeCS slot 102 (also shown in FIG. 1B). The plated vertical signal trace 120 has the trace thickness t (also shown in FIG. 1B). Moreover, the plated vertical signal trace 120 includes a signal trace width w (herein referred to as "the trace width w"). The trace width w is typically expressed in units of mils and mm.

A relationship between the trace separation h, the trace thickness t, and the trace width w is used to approximate the impedance of the modified microstrip, that in the present discussion is represented by the single-ended VeCS 100. The relationship is expressed as the equation:

$$Z_0 = \frac{87\Omega}{\sqrt{\varepsilon_{r+1.41}}} \ln\left(\left(\frac{5.98h}{0.8w+t}\right)\right),\qquad \text{Equation 1}$$

where, $Z_0$ represents the characteristic impedance of the single-ended VeCS 100 in Ω, $\delta_r$ is the unitless dielectric constant of the material of the plated vertical signal trace 120 (typically copper) and the air (typically approximately unity) in the VeCS slot 102, and the trace separation h, the trace thickness t, and the trace width w are as described above in units of mils.

In at least some embodiments, one or more software tools are used to calculate the values of the trace separation h, the trace thickness t, and the trace width w. Such software tools include, without limitation, Si9000e Transmission Line Field Solver available through Polar Instruments Ltd. The values of the trace separation h, the trace thickness t, and the trace width w are used to at least partially determine the dimensions of the VeCS slot 102, including the VeCS slot width 112 and the VeCS slot length 111 that are manufacturable through the software tools previously identified. In some embodiments, values for the trace separation h, the trace thickness t, and the trace width w are estimated and inserted into equation 1 above to determine the approximate impedance $Z_0$ for a design of a single-ended VeCS 100. As previously described, the target design value for the impedance $Z_0$ for the single-ended VeCS 100 is approximately 50Ω. Therefore, in some embodiments, an iterative insertion of values for the trace separation h, the trace thickness t, and the trace width w to attain the target design value of 50 Ω impedance $Z_0$ is used to determine a preferred set of values of the trace separation h, the trace thickness t, and the trace width w. In some embodiments, for the trace separation h, the trace thickness t, and the trace width w, two of the three values are inserted to determine the third value given a known value for the target design value of the impedance $Z_0$ for the single-ended VeCS 100, e.g., approximately 50Ω.

Accordingly, in some embodiments, the thickness of the plated vertical signal trace 120 (trace thickness t), width of the plated vertical signal trace 120 (trace width w), and trace separation distance (trace separation h) have a relationship defined in Equation (1). The target design value for the impedance $Z_0$ is treated as a constant and the trace thickness t, trace width w, and trace separation h are varied to determine a set of optimized values thereof. The ranges of the trace thickness t, trace width w, and trace separation h are varied through a range of practical values that are within the prescribed fabrication methods and mechanisms. In some embodiments, a practical range for the trace width w is approximately 8 mils to approximately 20 mils (approximately 0.2 mm to approximately 0.5 mm). In some embodiments, a practical range for the trace separation h is approximately 14 mils to approximately 80 mils (approximately 0.36 mm to approximately 2 mm). In some embodiments, a practical range for the trace thickness t is approximately 1.2 mils to approximately 3.5 mils (approximately 0.03 mm to approximately 0.09 mm).

Therefore, the impedance of the single-ended VeCS 100 is controlled at the design phase through using a substantially planar plated vertical reference trace 110 rather than a rounded reference trace. The elimination of any rounding or curvatures of the plated vertical reference trace 110 facilitates preventing field distortion in the VeCS slot 102. Further design control includes determining the trace separation h between the plated vertical reference trace 110 and the plated vertical signal trace 120, the trace thickness t of the plated vertical signal trace 120, and the trace width w of the plated vertical signal trace 120. Accordingly, the geometry of the single-ended VeCS 100 is adjusted to provide the desired impedance thereof, including the dimensions of the plated vertical signal trace 120 and the VeCS slot 102, as discussed further below.

In some embodiments, the values of the trace width w, the trace thickness t, and the trace separation h, are determined to provide the desired $Z_0$. In addition, the value of the $\varepsilon_r$ is the dielectric constant of the material of the plated vertical signal trace 120 (typically copper) and the air (typically approximately unity) in the VeCS slot 102 is used to determine the VeCS slot width 112 and the VeCS slot length 111. In some embodiments, the unitless values of the dielectric constant ($\varepsilon_r$) of the material of the plated vertical signal trace 120 (typically copper) and the air (typically approximately unity) in the VeCS slot 102 are varied (see FIG. 5 for one example of varying the dielectric constant of the VeCS slot 102).

Accordingly, such optimization of the values of trace width w, the trace thickness t, and the trace separation h to provide the proper impedance is directed toward facilitating proper operation of modern PCIe above version 4.0, i.e., PCEe 5.0 and 6.0. Specifically, the implementation of proper impedance matching between the vertical signal trace, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

Figure 2:
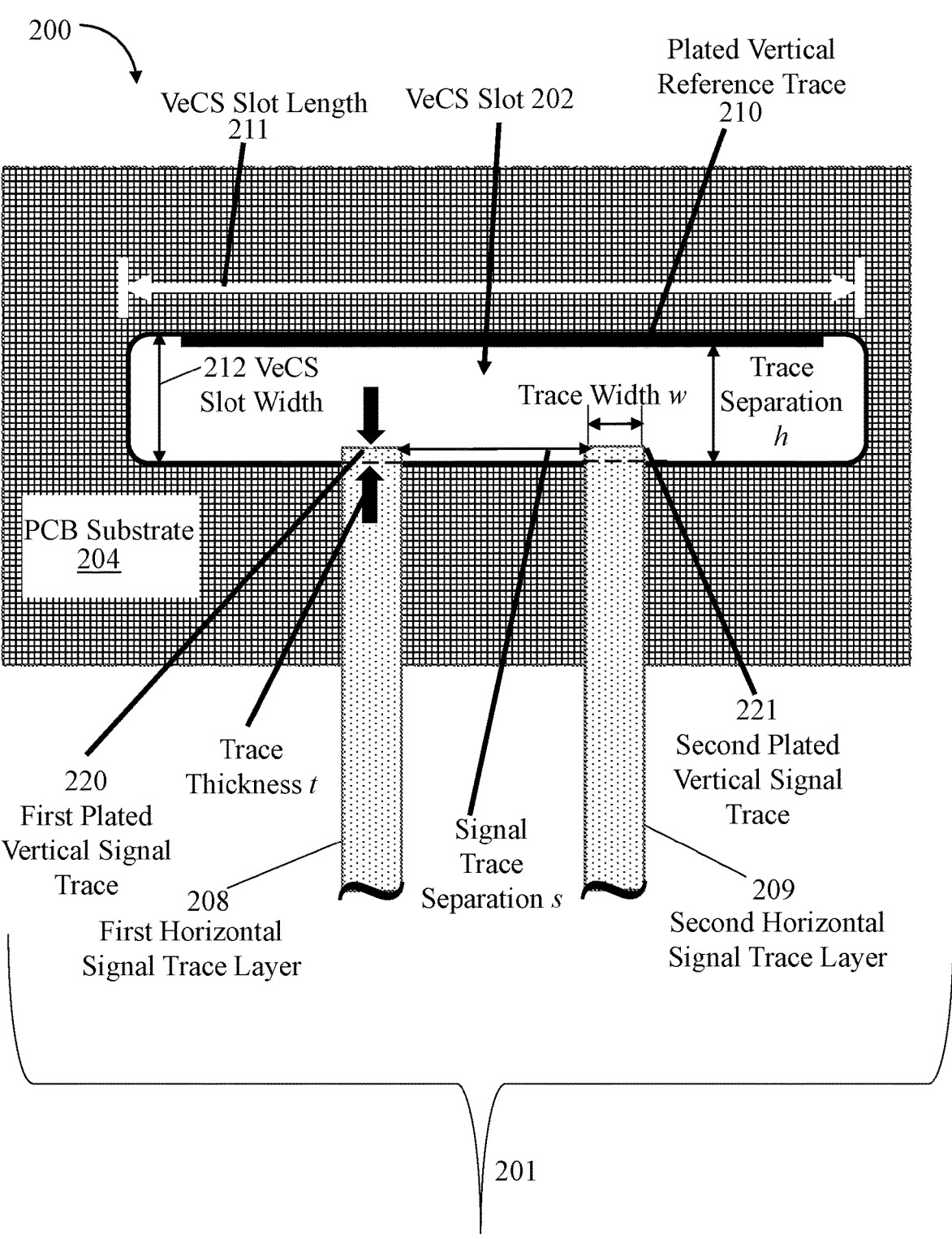
FIG. 2 is a schematic diagram illustrating an overhead view of a differential vertical conductive structure, in accordance with some embodiments of the present disclosure.

Referring to FIG. 2, a schematic diagram is presented illustrating an overhead view of a differential vertical conductive structure 200, herein referred to as the differential VeCS 200, in accordance with some embodiments of the present disclosure. In contrast to the single-ended configuration of FIGS. 1A-1C, in general, a differential signal configuration includes two complementary signals, each with its own trace, as contrasted to the single-ended-VeCS configuration. While the single trace of the single-ended configuration is relatively inexpensive to manufacture relative to the differential signal configuration, the differential signal configuration is more costly since there are two conductors for the single-ended configurations' one trace. However, the differential signal configuration provides for more stable data transfer when electromagnetic interference (EMI) and radiofrequency interference (RFI) are expected and the resultant noise presented by other configurations is not tolerable for the intended use. The differential VeCS 200 defines a modified microstrip, and hence, a modified electric transmission line in a manner similar to that described for the single-ended VeCS 100 (see FIG. 1B). The differential VeCS 200 is a portion of a larger printed circuit board (PCB) 201.

In one or more embodiments, the differential VeCS 200 is similar to the single-ended VeCS 100 (shown in FIGS. 1A-1C) for transitioning signals through the PCB 201. The differential VeCS 200 includes a VeCS slot 202 that is formed in a PCB substrate 204. The PCB substrate 204 is fabricated from any dielectric material that enables operation of the differential VeCS 200 as described herein. The VeCS slot 202 is defined through one or more PCB walls 206 of the PCB substrate 204. The differential VeCS 200 further includes a plated vertical reference trace 210 that is similar to the plated vertical reference trace 110 (see FIGS. 1A-C). In contrast to the single-ended VeCS 100, the differential VeCS 200 is configured to receive two horizontal single trace layers, i.e., a first horizontal signal trace layer 208 and a second horizontal signal trace layer 209 that are similar to the horizontal signal trace layer 108 (see FIGS. 1A-C). The differential VeCS 200 includes two plated vertical signal traces, i.e., a first plated vertical signal trace 220 and a second plated vertical signal trace 221 that are similar to the plated vertical signal trace 120 (see FIGS. 1A-C). The first plated vertical signal trace 220 and the second plated vertical signal trace 221 are substantially similar. The first plated vertical signal trace 220 is electrically coupled to the first horizontal signal trace layer 208 and the second plated vertical signal trace 221 is electrically coupled to the second horizontal signal trace layer 209.

The first plated vertical signal trace 220 and the second plated vertical signal trace 221 have the trace thickness t. The first and second plated vertical signal traces 220 and 221 and the plated vertical reference trace 210 define the trace separation h within the VeCS slot 202. Moreover, the first and second plated vertical signal traces 220 and 221 have the trace width w. Therefore, the first plated vertical signal trace 220 and the second plated vertical signal trace 221 have similar a trace thickness t and a similar trace width w. In addition, the differential VeCS 200 defines a horizontal signal trace layer separation distance s (herein referred to as "the signal trace separation s") that extends between the first plated vertical signal trace 220 and the second plated vertical signal trace 221. The signal trace separation s is typically expressed in units of mils and mm. In some embodiments, the values of the signal trace separation s are at least partially subject to the number of plated vertical signal traces. In some embodiments, the values of the trace thickness t, the trace separation h, and the trace width w of the differential VeCS 200 are similar to those of the single-ended VeCS 100 (shown in FIGS. 1A-1C).

Relationships between the trace separation h, the trace thickness t, the trace width w, and the signal trace separation s are used to approximate the impedance of the modified microstrip, that in the present discussion, is represented by the differential VeCS 200. A first relationship is expressed as equation 1 as described above for the single-ended VeCS 100 (see FIG. 1C).
A Second Relationship is Expressed as:

$$Z_{diff} = 2Z_0\left(1 - 0.48e^{\left(-.096\frac{s}{h}\right)}\right), \qquad \text{Equation 2}$$

where, $Z_{diff}$ represents the characteristic impedance of the differential VeCS 200 in $\Omega$, and $Z_0$ is the characteristic impedance of the single-ended VeCS 100 in $\Omega$. Inserting the expression of $Z_0$ of Equation 1 into Equation 2 results in:

$$Z_{diff} = \frac{174\Omega}{\sqrt{\varepsilon_{r+1.41}}} \ln\left(\frac{5.98h}{0.8w + t}\right)\left(1 - 0.48e^{\left(-.096\frac{s}{h}\right)}\right). \qquad \text{Equation 3}$$

In at least some embodiments, as described for the single-ended VeCS 100 one or more software tools are used to calculate the values of the trace separation h, the trace thickness t, the trace width w, and the signal trace separation s. The manufactural values of the trace separation h, the trace thickness t, the trace width w, and the signal trace separation s are used to at least partially determine the dimensions of the VeCS slot 202, including the VeCS slot width 212 and the VeCS slot length 211 through the software tools previously identified. In some embodiments, values for the trace separation h, the trace thickness t, the trace width w, and the signal trace separation s are estimated and inserted into equation 3 above to determine the approximate impedance $Z_{diff}$ for a design of the differential VeCS 200. The target design value of the impedance $Z_{diff}$ for the differential VeCS 200 is approximately 85$\Omega$. Therefore, in some embodiments, an iterative insertion of values for the trace separation h, the trace thickness t, the trace width w, and the signal trace separation s to attain the target design value of 85$\Omega$ for the impedance $Z_{diff}$ that is used to determine a preferred set of values of the trace separation h, the trace thickness t, the trace width w, and the signal trace separation s. In some embodiments, for the trace separation h, the trace thickness t, the trace width w, and the signal trace separation s, three of the four values are inserted to determine the fourth value given a known value for the target design value for the impedance $Z_{diff}$ for the differential VeCS 200, e.g., approximately 85Ω.

In some embodiments, the thickness of the vertical signal traces 220 and 221 (trace thickness t), width of the vertical signal traces 220 and 221 (trace width w), separation distance (trace separation h), and signal trace separation distance (signal trace separation s) have a relationship defined in Equation (3). The target design value for the impedance $Z_{diff}$ is treated as a constant and the trace thickness t, trace width w, trace separation h, and signal trace separation s are varied to determine a set of optimized values thereof. Therefore, the impedance of the differential VeCS 200 is controlled at the design phase through using a single, substantially flat, plated vertical reference trace 210 rather than a rounded reference trace and determining the trace separation h between the plated vertical reference trace 110 and the first and second plated vertical signal traces 220 and 221, respectively. In addition, determination of the trace thickness t of the plated vertical signal trace 220, the trace width w of the plated vertical signal trace 220, and the signal trace separation s between the first and second plated vertical signal traces 220 and 221 are also made. In some embodiments, the unitless values of the dielectric constant ($\varepsilon_r$) of the material of the plated vertical signal trace 220 (typically copper) and the air (typically approximately unity) in the VeCS slot 202 are varied (see FIG. 5 for one example of varying the dielectric constant of the VeCS slot 202). Accordingly, the geometry of the differential VeCS 200 is adjusted to provide the desired impedance thereof, including the dimensions of the first and second plated vertical signal traces 220 and 221, respectively, and the VeCS slot 202.

Accordingly. Such optimization is directed toward facilitating proper operation of modern PCIe above version 4.0, i.e., PCEe 5.0 and 6.0. Specifically, the implementation of proper impedance matching between the vertical signal traces, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

Figure 3A:
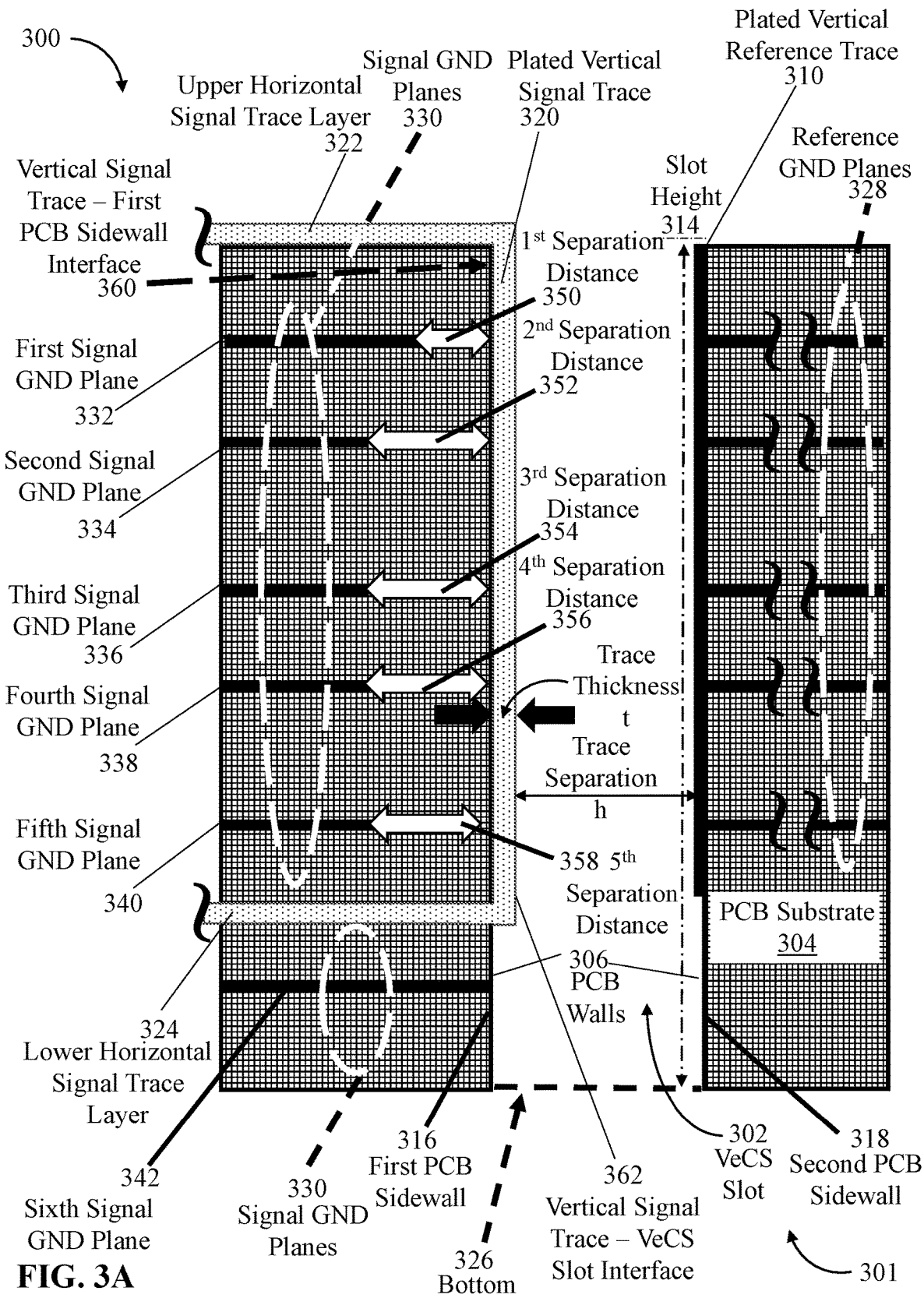
FIG. 3A is a schematic diagram illustrating a side view of a single-ended vertical conductive structure, in accordance with some embodiments of the present disclosure.

Referring to FIG. 3A, a schematic diagram is presented illustrating a side view of a single-ended vertical conductive structure 300, herein referred to as the single-ended VeCS 300, in accordance with some embodiments of the present disclosure. The single-ended VeCS 300 is configured to transition signal through the respective layers of the PCB 301. While the following embodiments are presented with respect to single-ended VeCS configurations, such embodiments are also implemented on differential vertical conductive structures. The single-ended VeCS 300 is a portion of a larger printed circuit board (PCB) 301. In addition, the single-ended VeCS 300 defines a modified microstrip, and hence, a modified electric transmission line in a manner similar to that described for the single-ended VeCS 100 (see FIG. 1B). The single-ended VeCS 300 is similar to the VeCS 100 shown in FIGS. 1A through 1C; therefore, a similar numbering scheme for similar components that has been used in FIG. 1B is used in FIG. 3 and any substantial differences are described further herein. Accordingly, unless otherwise noted, those components of FIG. 3A with similar component numbers as FIG. 1B are substantially similar and will not be further described in detail unless necessary.

In one or more embodiments, the plated vertical signal trace 320 and the first PCB sidewall 316 define a vertical signal trace—first PCB sidewall interface 360. Also, in some embodiments, the plated vertical signal trace 320 and the VeCS slot 302 define a vertical signal trace—VeCS slot interface 362.

In at least some embodiments, the single-ended VeCS 300 includes a plurality of signal GND planes 330. Specifically, the signal GND planes 330 include a first ($1^{st}$) signal GND plane 332 that defines a first separation distance 350 between the first signal GND plane 332 and the first PCB sidewall 316 and the plated vertical signal trace 320. The purpose of the first separation distance 350 is to mitigate a potential for electrical discontinuities of the plated vertical signal trace 320 due to a second GND plane 330 shorting the plated vertical signal trace 320 to ground. Values for the first separation distance 350 are discussed further herein. In some embodiments, each signal GND plane 330 is fabricated from a current-carrying conductor, e.g., and without limitation, copper. The configurations of the signal GND planes 330 are discussed further below and with respect to FIG. 3B.

In some embodiments, in contrast to the embodiments disclosed with respect to FIG. 1B, the signal GND planes 330 include a second ($2^{nd}$) signal GND plane 334 that defines a second separation distance 352 between the first signal GND plane 332 and the first PCB sidewall 316 and the plated vertical signal trace 320. Values for the second separation distance 352 are discussed further herein. Also, the signal GND planes 330 include a third signal GND plane 336 that defines a third ($3^{rd}$) separation distance 354 between the third signal GND plane 336 and the first PCB sidewall 316 and the plated vertical signal trace 320. Values for the third separation distance 354 are discussed further herein. Further, the signal GND planes 330 include a fourth signal GND plane 338 that defines a fourth ($4^{th}$) separation distance 356 between the fourth signal GND plane 338 and the first PCB sidewall 316 and the plated vertical signal trace 320. Values for the fourth separation distance 356 are discussed further herein. In addition, the signal GND planes 330 include a fifth signal GND plane 340 that defines a fifth ($5^{th}$) separation distance 358 between the fifth signal GND plane 340 and the first PCB sidewall 316 and the plated vertical signal trace 320. Values for the fifth separation distance 358 are discussed further herein.

In some embodiments, the signal GND planes 330 include a sixth signal GND plane 342 that extends to the first PCB sidewall 316 and there is no associated separation distance. The sixth signal GND plane 342 is positioned within the PCB substrate 304 below the lower horizontal signal trace layer 324. As such, the plated vertical signal trace 320 ends at the junction with the lower horizontal signal trace layer 324 and does not extend to the bottom 326. The potential for electrical discontinuities of the plated vertical signal trace 320 due to the sixth signal GND plane 342 shorting the plated vertical signal trace 320 to ground are minimal. In some embodiments, a common practice is to horizontally extend the respective signal GND planes 330 as close to the vertical signal trace—first PCB sidewall interface 360 as practical without risking a short between the respective signal GND plane 330 and the plated vertical signal trace 320. The purpose is to configure the sixth signal GND plane 342 to parallel the lower horizontal signal trace layer 324 to mitigate a potential for developing any reference gaps under the lower horizontal signal trace layer 324. The formation of reference gaps increases the potential for electrical discontinuities along the lower horizontal signal trace layer 324. As such, the sixth signal GND plane 342 provides the desired ground reference to the lower horizontal signal trace layer 324 to facilitate proper voltage thereon and facilitate proper current for uninterrupted data transmission therethrough. Accordingly, the sixth signal GND plane 342 extends under, and proximate to, the lower horizontal signal trace layer 324 through the PCB substrate 304 to the first PCB sidewall 316 to provide the maximum extension of the reference, i.e., the sixth signal GND plane 342.

In one or more embodiments, the first separation distance 350 is approximately 50 to 70 mils (approximately 1.3 mm to 1.8 mm), where the value 50 to 70 mils is at least partially determined through empirical means. The first signal GND plane 332 extends to a point approximately 50 to 70 mils from the vertical signal trace—first PCB sidewall interface 360. As such, the first signal GND plane 332 extends toward the plated vertical signal trace 320 through the PCB substrate 304 and parallel to the upper horizontal signal trace layer 322. The approximately 50 to 70 mils first separation distance 350 facilitates mitigating any risk of a short circuit condition between the first signal GND plane 332 and the plated vertical signal trace 320. In addition, extending the first signal GND plane 332 parallel to the upper horizontal signal trace layer 322 out to approximately 50 to 70 mils from the plated vertical signal trace 320 provides a horizontal length sufficient to mitigate a potential for developing any reference gaps under the upper horizontal signal trace layer 322. The formation of reference gaps increases the potential for electrical discontinuities along the upper horizontal signal trace layer 322. As such, the first signal GND plane 332 provides the desired ground reference to the upper horizontal signal trace layer 322 to facilitate proper voltage thereon and facilitate proper current for uninterrupted data transmission therethrough. Accordingly, the first separation distance 350 is empirically determined to optimize the horizontal length of the first signal GND plane 332 for mitigating a potential for developing any reference gaps under the upper horizontal signal trace layer 322, facilitating proper voltage facilitate proper current on the upper horizontal signal trace layer 322 for uninterrupted data transmission, and mitigating any risk of a short circuit condition between the first signal GND plane 332 and the plated vertical signal trace 320.

In at least some embodiments, the second separation distance 352, the third separation distance 354, the fourth separation distance 356, and the fifth separation distance 358 are each at least approximately 100 mils to approximately 120 mils (approximately 2.5 mm to approximately 3 mm). In general, the second separation distance 352 exceeds the approximately 50 to 70 mil value of the first separation distance 350 since the second signal GND plane 334 is not proximate either of the upper horizontal signal trace layer 322 and the lower horizontal signal trace layer 324. Therefore, the mitigation of a risk of reference gaps under the upper horizontal signal trace layer 322 and under the lower horizontal signal trace layer 324 is not as important with respect to the second signal GND plane 334 as that associated with the first signal GND plane 332 and the sixth signal GND plane 342 as previously described. Also, in general, positioning the first signal GND plane 332 under and proximate the upper horizontal signal trace layer 322 has a beneficial effect since a significant portion of the respective field is induced through the upper horizontal signal trace layer 322 below the upper horizontal signal trace layer 322. Similarly, positioning the sixth signal GND plane 342 under and proximate the lower horizontal signal trace layer 324 has a beneficial effect since a significant portion of the respective field is induced through the lower horizontal signal trace layer 324 below the lower horizontal signal trace layer 324.

In some embodiments, in a manner similar to that previously described for the second separation distance 352 and the second signal GND plane 334, the third separation distance 354, the fourth separation distance 356, and the fifth separation distance 358 are approximately 100 mils to 120 mils for the third signal GND plane 336, the fourth signal GND plane 338, and the fifth signal GND plane 340, respectively. Accordingly, the greater distance of the of the second separation distance 352, the third separation distance 354, the fourth separation distance 356, and the fifth separation distance 358 provides a greater margin of mitigating a short circuit risk with the plated vertical signal trace 320 than the first separation distance 350.

Figure 3B:
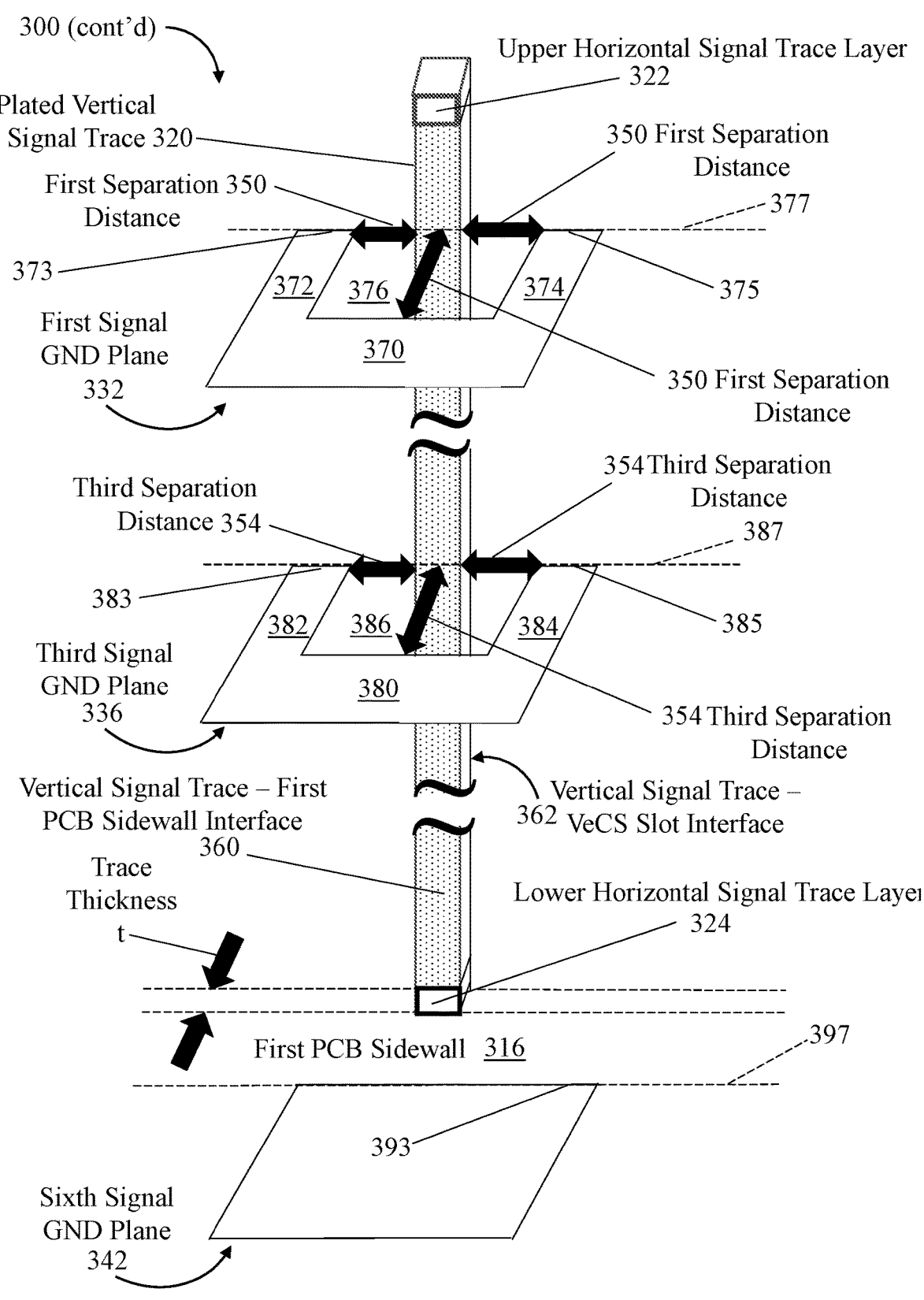
FIG. 3B is a schematic isometric diagram of the single-ended vertical conductive structure of FIG. 3A, in accordance with some embodiments of the present disclosure.

Referring to FIG. 3B, a schematic isometric diagram of the single-ended vertical conductive structure of FIG. 3A is presented, in accordance with some embodiments of the present disclosure. The first PCB sidewall 316 at and above the lower horizontal signal trace layer 324 and the PCB substrate 304 (see FIG. 3A) is not shown for clarity. The trace thickness t of the plated vertical signal trace 320 is defined between the vertical signal trace—first PCB sidewall interface 360 and the vertical signal trace—VeCS slot interface 362. The plated vertical signal trace 320 is shown with the vertical signal trace—first PCB sidewall interface 360 facing substantially outward from the page with a dotted pattern. The vertical signal trace—first PCB sidewall interface 360 extends between the upper horizontal signal trace layer 322 and the lower horizontal signal trace layer 324. FIG. 3B shows the first signal GND plane 332, the third signal GND plane 336, and the sixth signal GND plane 342. The second signal GND plane 334, the fourth signal GND plane 338, and the fifth signal GND plane 340 (see FIG. 3A) are not shown in FIG. 3B for clarity, where they are substantially similar to the third signal GND plane 336 and would be redundant for the present discussion.

In one or more embodiments, the first signal GND plane 332 is a unitary structure that includes a first portion 370, a second portion 372, and a third portion 374. The first signal GND plane 332 as shown in FIG. 3B includes the first portion 370, the second portion 372, and the third portion 374 isometrically extending into and out of the page. The second portion 372 and the third portion 374 extend orthogonally from the first portion 370 toward the plated vertical signal trace 320. Therefore, the first portion 370, the second portion 372, and the third portion 374 are positioned orthogonally to the vertical signal trace—first PCB sidewall interface 360. The first portion 370, the second portion 372, and the third portion 374 define a cutout 376. Therefore, in some embodiments, the first signal GND plane 332 is fabricated as a small sheet of a conductive material with the cutout 376. The second portion 372 includes a first edge 373 and the third portion 374 includes a second edge 375 that define a dashed line 377 that extends between the first edge 373 and the second edge 375. The dashed line 377 is configured to be at least partially coincident with the vertical signal trace—first PCB sidewall interface 360 at a position that is at least partially defined by the first separation distance 350. The first separation distance 350 defines the predetermined physical separation distance between the first portion 370, the second portion 372, and the third portion 374 of the first signal GND plane 332 and the vertical signal trace-first PCB sidewall interface 360 i.e., approximately 50 to 70 mils as described above with respect to FIG. 3A. The three black arrows illustrating the first separation distance 350 are not shown to scale. Accordingly, no portion of the first signal GND plane 332 will be closer to the plated vertical signal trace 320 than the first separation distance 350, thereby mitigating a potential for a short circuit condition between the first signal ground plane 332 and the plated vertical signal trace 320. In addition, the first signal GND plane 332 is sufficiently large to most effectively provide the ground potential proximate the plated vertical signal trace 320.

In one or more embodiments, the third signal GND plane 336 is a unitary structure that includes a first portion 380, a second portion 382, and a third portion 384. The third signal GND plane 336 as shown in FIG. 3BA includes the first portion 380, the second portion 382, and the third portion 384 isometrically extending into and out of the page. The second portion 382 and the third portion 384 extend orthogonally from the first portion 380 toward the plated vertical signal trace 320. Therefore, the first portion 380, the second portion 382, and the third portion 384 are positioned orthogonally to the vertical signal trace—first PCB sidewall interface 360. The first portion 380, the second portion 382, and the third portion 384 define a cutout 386. Therefore, in some embodiments, the third signal GND plane 336 is fabricated as a small sheet of a conductive material with the cutout 386. The second portion 382 includes a first edge 383 and the third portion 384 includes a second edge 385 that define a dashed line 387 that extends between the first edge 383 and the second edge 385. The dashed line 387 is configured to be at least partially coincident with the vertical signal trace—first PCB sidewall interface 360 at a position that is at least partially defined by the third separation distance 354. The third separation distance 354 defines the predetermined physical separation distance between the first portion 380, the second portion 382, and the third portion 384 of the third signal GND plane 336 and the vertical signal trace—first PCB sidewall interface 360 i.e., approximately 100 to 120 mils as described above with respect to FIG. 3A. The three black arrows illustrating the third separation distance 354 are not shown to scale. Accordingly, no portion of the third signal GND plane 336 will be closer to the plated vertical signal trace 320 than the third separation distance 354, thereby mitigating a potential for a short circuit condition between the third signal ground plane 336 and the plated vertical signal trace 320. In addition, the third signal GND plane 336 is sufficiently large to most effectively provide the ground potential proximate the plated vertical signal trace.

In one or more embodiments, the sixth signal GND plane 342 is a unitary structure. The sixth signal GND plane 342 as shown in FIG. 3B is isometrically extending into and out of the page. Therefore, the sixth signal GND plane 342 is positioned orthogonally to the first PCB sidewall 316. The sixth signal GND plane 342 includes an edge 393 that defines a dashed line 397. The dashed line 397 is configured to be coincident with the first PCB sidewall 316. As previously described, the sixth signal GND plane 342 extends to the first PCB sidewall 316 and there is no separation distance.

Figure 4:
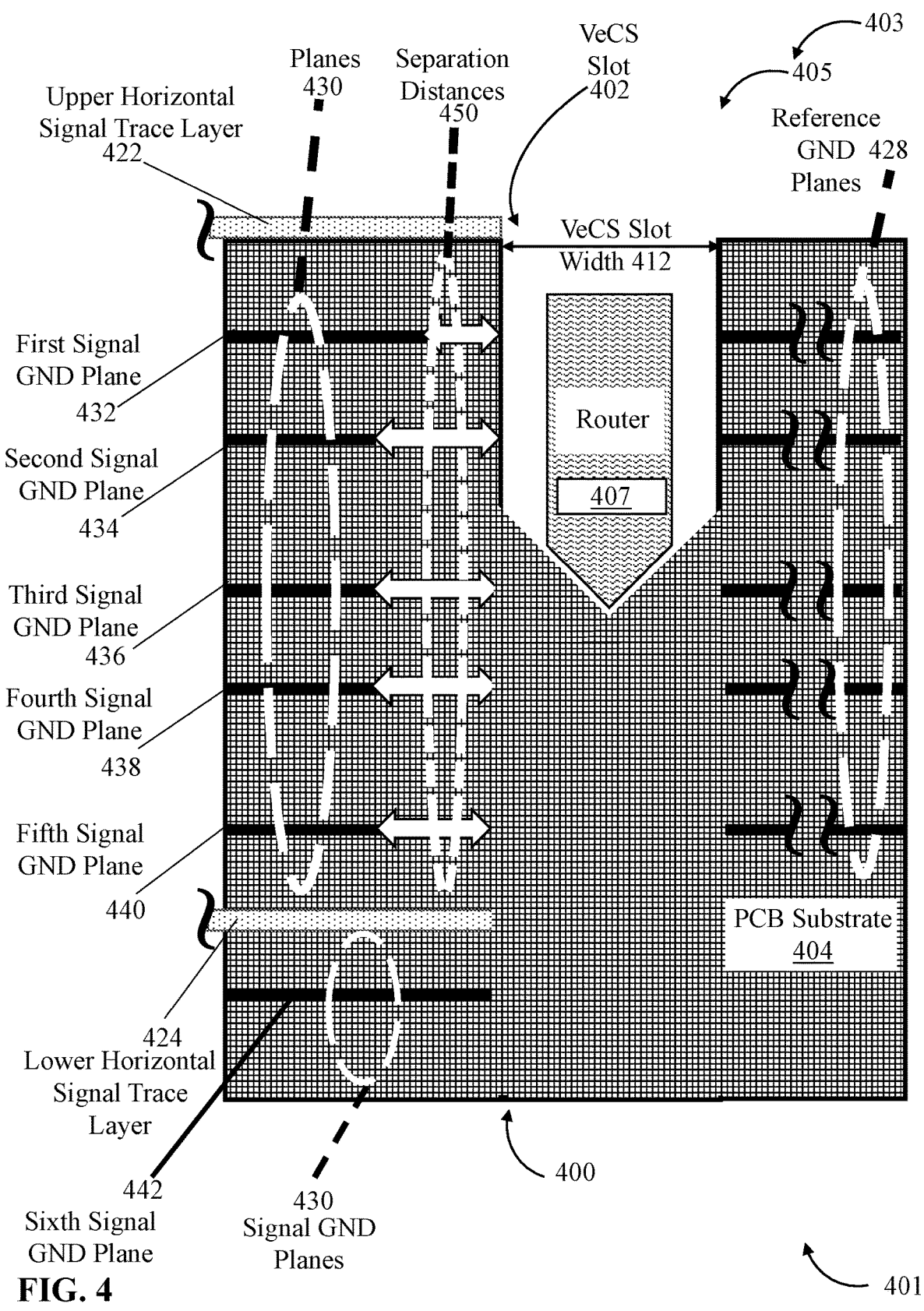
FIG. 4 is a schematic diagram illustrating a routing operation during fabrication of the single-ended vertical conductive structure shown in FIGS. 3A and 3B, in accordance with some embodiments of the present disclosure.

Referring to FIG. 4, a schematic diagram is presented illustrating a routing operation 405 during the fabrication process 403 of a single-ended VeCS 400 (shown in FIGS. 3A and 3B as the single-ended VeCS 300), in accordance with some embodiments of the present disclosure. In some embodiments, only the routing operation 405 is used. In some embodiments, only a drilling operation is used for more precise removal of the PCB substrate 404. In some embodiments, a drilling operation follows the routing operation 405. While the following embodiments are presented with respect to single-ended VeCS configurations, such embodiments are also implemented on differential vertical conductive structures. The single-ended VeCS 400 is a portion of a larger printed circuit board (PCB) 401. The single-ended VeCS 400 is similar to the single-ended VeCS 300 shown in FIGS. 3A and 3B; therefore, a similar numbering scheme for similar components that has been used in FIGS. 3A and 3B is used in FIG. 4 and any substantial differences are described further herein. Accordingly, unless otherwise noted, those components of FIG. 4 with similar component numbers as FIGS. 3A and 3B are substantially similar and will not be further described in detail unless necessary.

In at least some embodiments, the single-ended VeCS 400 represents the single-ended VeCS 300 at a point in the respective fabrication process 403 that includes the routing operation 405 to form the VeCS slot 402 (shown as VeCS slot 302 in FIG. 3A). As such, continuing to refer to FIG. 3, the VeCS slot 302, the PCB walls 306, the plated vertical reference trace 310, the slot height 314, the plated vertical signal trace 320 and its trace thickness t, the trace separation h, the bottom 326, the vertical signal trace—first PCB sidewall interface 360, and the vertical signal trace—VeCS slot interface 362 are not yet completely formed. The first separation distance 350, the second separation distance 352, the third separation distance 354, the fourth separation distance 356, and the fifth separation distance 358 are illustrated in FIG. 4 for reference; however, for clarity, they are labeled collectively as separation distances 450.

In one or more embodiments, the upper horizontal signal trace layer 422, the lower horizontal signal trace layer 424, the signal GND planes 430 and the reference GND planes 428 are positioned within the PCB substrate 404 prior to the routing operation 405. These components are set in (or on) the PCB substrate 404 at their respective predetermined dimensions as previously discussed. In general, given the small dimensions typically associated with PCBs similar to the PCB 401, and the resulting small fabrication tolerances associated with the formation of the VeCS slot 302, the routing operations 405 require precision. In some embodiments, removal of the PCB substrate 404 proximate the signal GND planes 430 is sufficiently precise to mitigate a potential for exposing the signal GND planes 430. In some embodiments, removal of the PCB substrate 404 proximate the signal GND planes 430 is sufficiently precise to mitigate a potential for inadvertent downward creep of the signal GND planes 430, thereby mitigating a potential for developing a short circuit condition between adjacent signal GND planes 430. In addition, removal of the PCB substrate 404 proximate the reference GND planes 428 is sufficiently precise to mitigate a potential for exposing the reference GND planes 428 beyond what is used for coupling the plated vertical reference trace 310 to the reference GND planes 428.

Furthermore, removal of the PCB substrate 404 proximate the reference GND planes 428 is sufficiently precise to mitigate a potential for inadvertent downward creep of the reference GND planes 428, thereby mitigating a potential for developing a short circuit condition between adjacent reference GND planes 428, within the guidelines of design rule checking (DRC). In general, DRC verifies whether a specific design meets the constraints imposed by the process technology to be used for manufacturing to ensure the design as to be implemented meets manufacturing requirements and will not result in a chip failure.

Moreover, in some embodiments, removal, through the routing operation 405, of the PCB substrate 404 proximate the upper horizontal signal trace layer 422 and the lower horizontal signal trace layer 424 is sufficiently precise to mitigate a potential for excessive material removal of the upper horizontal signal trace layer 422 and the lower horizontal signal trace layer 424. In addition, in some embodiments, removal of the PCB substrate 404 proximate the signal GND planes 430 is sufficiently precise to mitigate a potential for excessive material removal of the PCB substrate 404 that would shorten the separation distances 450 to less than acceptable tolerances. In some embodiments, removal, through the routing operation 405, of the PCB substrate 404 proximate the sixth signal GND plane 342 is sufficiently precise to mitigate a potential for excessive material removal of the PCB substrate 404 that would expose the sixth signal GND plane 342.

In some embodiments, the routing operation 405 of the single-ended VeCS 400 is executed through a router 407 using any methods and equipment that enables the routing operations 405 and the embodiments of the VeCS configurations as disclosed herein. Is some embodiments, the router 407 is configured to form the VeCS slot 302 with a VeCS slot width 412 of approximately 10 mils-15 mils (approximately 0.25 mm-0.38 mm). The precise dimensions of the VeCS slot width 412 are determined as described above with respect to FIG. 1C. Accordingly, the configuration of the single-ended VeCS 400 including the configurations and placements of the signal GND planes 430 and the respective separation distances 450, and the configurations and placements of the reference GND planes 428 prior to the routing operation 405 facilitates the precision fabrication of the PCB 401.

Figure 5:
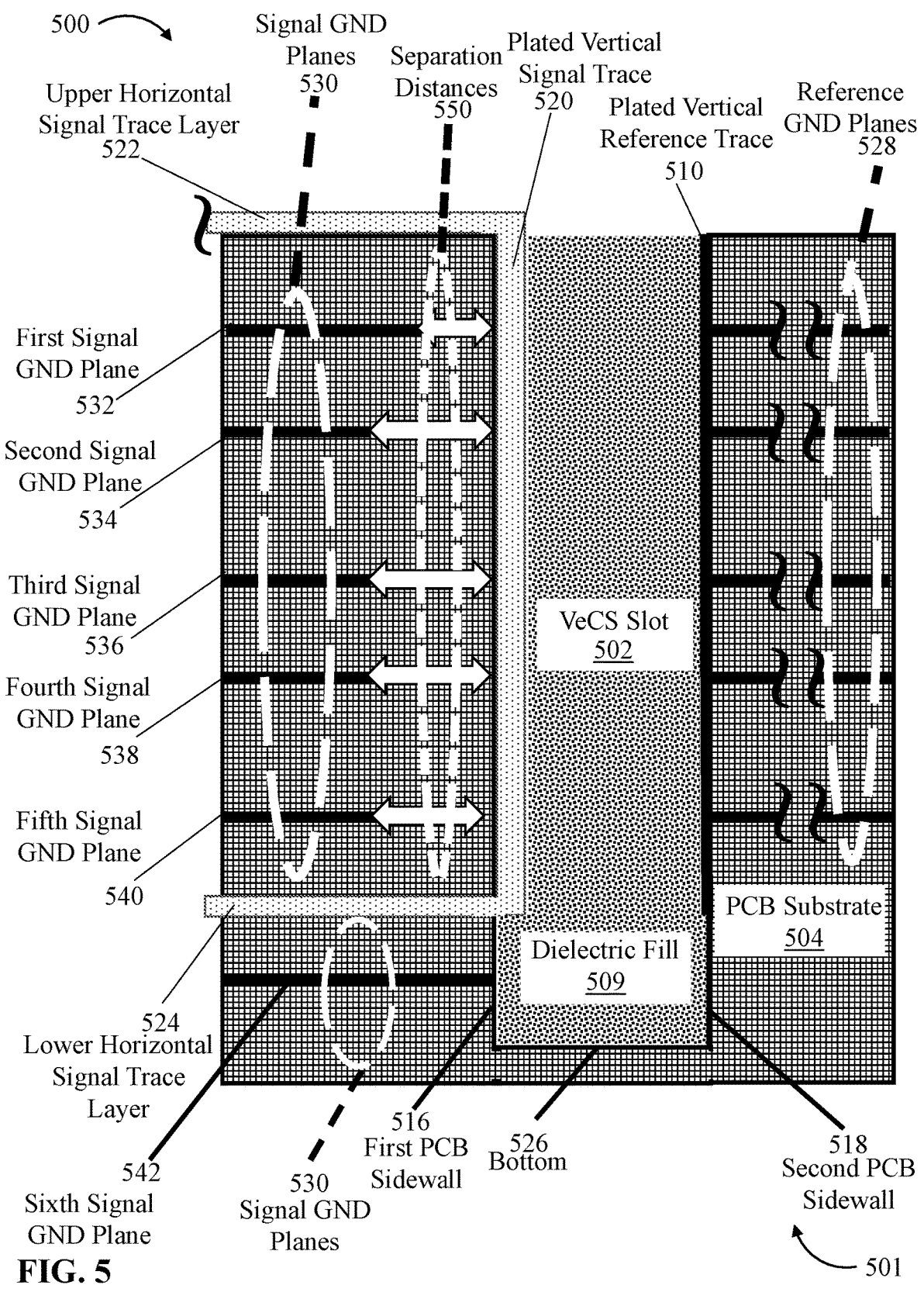
FIG. 5 is a schematic diagram of the single-ended vertical conductive structure shown in FIG. 4 with a dielectric fill, in accordance with some embodiments of the present disclosure.

Referring to FIG. 5, a schematic diagram is presented illustrating a single-ended VeCS 500 (shown in FIG. 4 as the single-ended VeCS 400) with a dielectric fill 509, in accordance with some embodiments of the present disclosure. For purposes of clarity and consistency with FIG. 4, the VeCS slot 402 of FIG. 4 is shown in FIG. 5 as the VeCS slot 502 populated with the dielectric fill 509. While the following embodiments are presented with respect to single-ended VeCS configurations, such embodiments are also implemented on differential vertical conductive structures. The single-ended VeCS 500 is a portion of a larger printed circuit board (PCB) 501. In addition, the single-ended VeCS 500 defines a modified microstrip, and hence, a modified electric transmission line in a manner similar to that described for the single-ended VeCS 100 (see FIG. 1B) and the single-ended VeCS 300 (shown in FIGS. 3A and 3B). The single-ended VeCS 500 is similar to the VeCS 500 shown in FIGS. 3A, 3B, and 4; therefore, a similar numbering scheme for similar components that has been used in FIGS. 3A, 3B, and 4 is used in FIG. 5 and any substantial differences are described further herein. Accordingly, unless otherwise noted, those components of FIG. 5 with similar component numbers as FIGS. 3A, 3B, and 4 are substantially similar and will not be further described in detail unless necessary.

In at least some embodiments, upon completion of the routing operation 405 (see FIG. 4), a dielectric fill 509 is inserted into the VeCS slot 402 that was formed during the routing operation 405. In some embodiments, the dielectric fill 509 is inserted into the VeCS slot 402 upon completion of inserting the plated vertical signal trace 520 adjacent to the first PCB sidewall 516 and inserting the plated vertical reference trace 510 adjacent to the second PCB sidewall 518. Once the fabrication activities within the VeCS slot 402 are completed, the dielectric fill 509 is inserted from the bottom 526 to approximately the top of the plated vertical reference trace 510. The dielectric fill 509 is inserted into the VeCS slot 502 through any methods that enable operation of the single-ended VeCS 500 as described herein. The dielectric fill 509 is fabricated from any dielectric material that enables operation of the single-ended VeCS 500 as described herein.

In some embodiments, the dielectric fill 509 facilitates impedance matching within the single-ended VeCS 500. In some embodiments, the dielectric fill 509 includes a dielectric constant that exceeds unity (1) (a unitless value). In some embodiments, the value of the unitless dielectric constant of the material of the plated vertical signal trace 520 (typically copper) and the air (typically approximately unity) in the VeCS slot 502, i.e., $\varepsilon_r$ of equations (1) and (3), is altered by the addition of the dielectric fill 509. Accordingly, the use of the dielectric fill 509 could alter the value of $Z_0$ that represents the characteristic impedance of the single-ended VeCS 500 (see equation (1)) and the value of $Z_{diff}$ that represents the characteristic impedance of the differential VeCS 200 (see equation (3)). In some embodiments, the flexibility to adjust the overall impedance of the VeCS configurations facilitates designing and fabricating a wider range of PCBs. For example, the trace separation h, the trace thickness t, the trace width w, and the signal trace separation s (for the differential VeCS embodiments) may be altered in conjunction with the dielectric constant to maintain the value of 50Ω for the single-ended VeCS configurations and maintain 85Ω for the differential VeCS configurations. In some embodiments, for example, and without limitation, fabrication of the VeCSs described herein with a dielectric fill that has a dielectric constant $\varepsilon_r$ greater than that of air (typically approximately unity) provides opportunities for smaller values for the widths of the plated vertical signal traces 520 (the trace width w). In addition, opportunities are presented for smaller values for the thickness of the plated vertical signal traces 520 (the trace thickness t), larger values for the trace separation h between the plated vertical signal trace 520 and the plated vertical reference trace 510 within the VeCS slot 502, and a greater value for the signal trace separation s between the first horizontal signal trace layer 208 and a second horizontal signal trace layer 209 (see FIG. 2).

In some embodiments, the flexibility to adjust the overall impedance of the VeCS configurations facilitates designing and fabricating a wider range of PCBs. For example, the trace separation h, the trace thickness t, the trace width w, and the signal trace separation s (for the differential VeCS embodiments) may be altered in conjunction with the dielectric constant to maintain the value of 50Ω for the single-ended VeCS configurations and maintain 85Ω for the differential VeCS configurations. For example, and without limitation, fabrication of the VeCSs described herein with a dielectric fill that has a dielectric constant $\varepsilon_r$ greater than that of air (typically approximately unity) provides opportunities for smaller values for the trace width w and the trace thickness t, as well as larger values for the trace separation h and the signal trace separation s.

Figure 6:
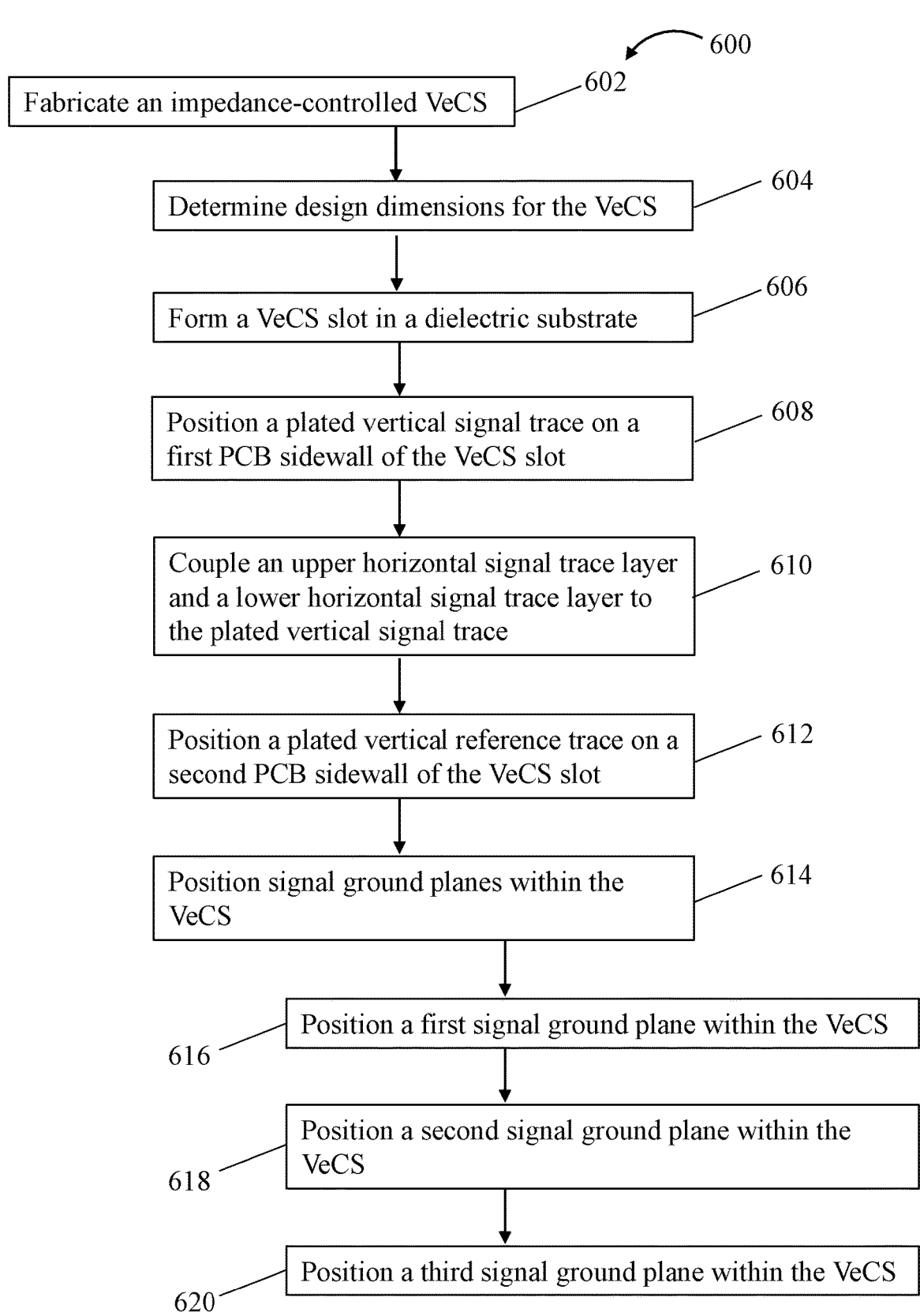
FIG. 6 is a flowchart illustrating a process for fabricating a printed circuit board (PCB), in accordance with some embodiments of the present disclosure.

Referring to FIG. 6, a flowchart is presented illustrating a process 600 for fabricating a printed circuit board (PCB), in accordance with some embodiments of the present disclosure. The process 600 is at least partially used to fabricate PCBs 101, 201, 301, 401, and 501 as shown in the respective FIGS. 1A through 5. In general, further discussion of the process 600 references FIGS. 3A and 3B, and any discussions with respect to the other FIGURES are clearly identified.

In at least some embodiments, the process 600 includes fabricating the vertical conductive structure (VeCS) 300, where the single-ended is impedance-controlled, i.e., the single-ended VeCS 300 has a predetermined impedance determined at the design phase of the single-ended VeCS 300 and the PCB 301. This is illustrated at step 602. In some single-ended VeCS embodiments, such as that shown in FIGS. 3A and 3B, the predetermined impedance is approximately 50Ω. In some differential VeCS embodiments, such as that shown in FIG. 2, the predetermined impedance is approximately 85

In one or more embodiments, the predetermined impedance, referred to as the target design value, or target value of the impedance, is used for determining design dimensional values for the VeCS slot 302. This is illustrated at step 604. In some single-ended VeCS configurations, the target value of the impedance is used for determining design values for a thickness t of a vertical signal trace, i.e., the plated vertical signal trace 320. The target value of the impedance is also used for determining design values for a width w of the plated vertical signal trace 320. The target value of the impedance is further used for determining design values for a trace separation h between the plated vertical signal trace 320 and a vertical reference trace, i.e., the plated vertical reference trace 310. The slot length and width are not shown in FIG. 3A; therefore, referring to FIGS. 1A and 1C for the single-ended version of the VeCS, the VeCS slot length 111 and the VeCS slot width 112 are also determined. The details of determining the design values of the VeCS slot 102 are described with respect to FIG. 1C. Accordingly, such design values are at least partially dependent on the predetermined impedance.

In some differential VeCS embodiments, i.e., those embodiments shown in FIG. 2, where there is a first plated vertical signal trace 220 and a second plated vertical signal trace 221, the target value of the impedance is used for determining design values for a width w of the plated vertical signal traces 220 and 221. The target value of the impedance is further used for determining design values for the trace separation h between the first and second plated vertical signal traces 220 and 221 and the plated vertical reference trace 310. Moreover, the target value of the impedance is further used for determining design values for the trace separation distance s between the first and second plated vertical signal traces 220 and 221. In addition, the VeCS slot length 211 and the VeCS slot width 212 are determined. The details of determining the design values of the VeCS slot 202 are described with respect to FIG. 2. Accordingly, such design values of are at least partially dependent on the predetermined impedance.

In one or more embodiments, the step 602 includes forming the VeCS slot 302 in a dielectric substrate, i.e., the PCB substrate 304, where the VeCS slot 302 is substantially rectangular and defines a first side, i.e., the first PCB sidewall 316 and an opposing second side, i.e., the second PCB sidewall 318. This is illustrated at step 606. The step 606 is accomplished, in at least some embodiments, through routing as discussed with respect to FIG. 4. In some embodiments, any methods and mechanisms are employed to form the VeCS slot 302 that enable operation of the VeCS structures described herein.

In some embodiments, the process 600 also includes positioning a vertical signal trace, i.e., the plated vertical signal trace 320 on the first PCB sidewall 316 of the VeCS slot 302. This is illustrated at step 608. In some embodiments, the step 608 is executed through a plating process. In some embodiments, any methods and mechanisms are employed to position the plated vertical signal trace 320 on the first PCB sidewall 316 of the VeCS slot 302 that enable operation of the VeCS structures described herein.

The process 600 further includes electrically coupling the upper horizontal signal trace layer 322 and the lower horizontal signal trace layer 324 to the plated vertical signal trace 320. This is illustrated at step 610. In some embodiments, the upper horizontal signal trace layer 322, the plated vertical signal trace 320, and the lower horizontal signal trace layer 324 define a signal transmission path through the single-ended VeCS 300.

In at least some embodiments, the process 600 further includes positioning a vertical reference trace, i.e., the plated vertical reference trace 310 on second PCB sidewall 318 of the VeCS slot 302, there the plated vertical reference trace 310 is planar. This is illustrated at step 612. In some embodiments, the step 612 is executed through a plating process. In some embodiments, any methods and mechanisms are employed to position the plated vertical reference trace 310 on the second PCB sidewall 318 of the VeCS slot 302 that enable operation of the VeCS structures described herein.

In one or more embodiments, the process 600 includes positioning signal ground planes, i.e., signal GND planes 330 within the single-ended VeCS 300. This is illustrated as step 614. In some embodiments, the step 614 includes positioning a first signal ground plane, i.e., the first signal GND plane 332 a first separation distance 350 from the plated vertical signal trace 320. This is illustrated as step 616. The first signal ground plane 332 parallels the upper horizontal signal trace layer 322. In some embodiments, the step 614 also includes positioning a second signal ground place, i.e., the second signal GND plane 334 a second separation distance 352 from the plated vertical signal trace 320. This is illustrated as step 618. The second separation distance 352 is greater than the first separation distance 350. In some embodiments, the step 614 also includes positioning a third signal ground place, i.e., the sixth signal GND plane 342 below the lower horizontal signal trace layer 324. This is illustrated as step 618. The sixth signal GND plane 342 extends proximate the VeCS slot 302, i.e., there is no separation distance. In some embodiments, the signal GND planes 330 are positioned within the single-ended VeCS 300 prior to the step 606 for forming the VeCS. In some embodiments, the VeCS slot 302 is backfilled per FIG. 5.

In some embodiments, the fabrication process includes forming the plated vertical signal trace 320 and the plated vertical reference trace 310 though deposition of the respective copper. In some of those embodiments, the plated vertical signal trace 320 extends to the bottom 326. In order to reduce stub formation in the single-ended VeCS 300. In general, a stub in a PCB is a portion of a transmission line that is not fully terminated at both ends. Therefore, with reference to FIG. 3A, an unused portion of the plated vertical signal trace 320 (not shown) would extend below the lower horizontal signal trace layer 324. Stubs have the potential to induce signal integrity issues, such as reflections and signal degradation, through signal distortion and interference. Accordingly, in some embodiments, prior to adding the dielectric fill 509, the stub is removed through back-routing of the VeCS slot 302/502.

According to an aspect of the disclosure, a vertical conductive structure (VeCS) for a printed circuit board (PCB) is presented. A VeCS slot is at least partially defined in a dielectric substrate. A vertical signal trace is positioned on a first side of the VeCS slot. A vertical reference trace is positioned on a second side of the VeCS slot opposite the vertical signal trace.

In embodiments, the VeCS facilitates the improvement of the overall signal integrity of the PCB through adding a reference plane in the form of the vertical reference trace to the VeCS. The vertical reference trace is typically maintained at ground potential. The plated metal solid reference opposite the vertical signal trace(s) creates a quasi-microstrip vertical configuration and facilitates reducing any potential for discontinuities of the plated vertical signal trace. In addition, the vertical reference trace mitigates a potential for errant signals interfering with other traces and inducing antenna-like behavior in portions of the PCB that increases noise levels on the PCB.

According to an aspect of the disclosure, the vertical reference trace of the VeCS is planar.

In embodiments, the planar vertical reference trace eliminates the rounded segments of the reference planes in some known VeCSs, thereby eliminating any deleterious reflections at the higher signal speeds and enhancing the signal integrity and mitigating field distortions.

According to an aspect of the disclosure, the VeCS is a single-ended VeCS.

In embodiments, a single-ended VeCS configuration includes a single trace that extends from a source to a routed destination. The single-ended VeCS configuration is the most cost-efficient option to implement because fewer wires are required for transmitting multiple signals. Therefore, since the single-ended VeCS configuration is a popular configuration, PCBs that use single-ended VeCSs will benefit from the improved performance over that of known vias and microvias.

According to an aspect of the disclosure, the VeCS is a differential VeCS and the vertical signal trace is a first vertical signal trace. The VeCS further includes a second vertical signal trace positioned on the first side of the VeCS slot. The first and second vertical signal traces are separated by a signal trace separation distance, and the first and second vertical signal traces have similar widths and thicknesses.

In embodiments, as contrasted to the single-ended VeCs, a differential VeCS configuration includes two complementary signals, each with its own trace. While the differential signal configuration is more costly since there are two signal traces, the differential VeCS configuration provides for more stable data transfer when electromagnetic interference (EMI) and radiofrequency interference (RFI) are expected and the resultant noise is not tolerable for the intended use through other configurations.

According to an aspect of the disclosure, the VeCS further includes one or more reference ground planes electrically coupled to the vertical reference trace.

In embodiments, the plated vertical reference trace extends through substantially the same portion of the VeCS slot height opposite the plated vertical signal trace to induce the proper reference voltage. The electrical coupling of the reference GND planes to the plated vertical reference trace facilitates proper grounding of the plated vertical reference trace.

According to an aspect of the disclosure, a vertical conductive structure (VeCS) for a printed circuit board (PCB) is presented. The VeCS includes a VeCS slot at least partially defined in a dielectric substrate. The VeCS also includes a vertical signal trace positioned on a first side of the VeCS slot. The VeCS further includes a vertical reference trace positioned on a second side of the VeCS slot opposite the vertical signal trace. The VeCS has a predetermined impedance.

In embodiments, the thickness of the vertical signal trace (trace thickness t), width of the vertical signal trace (trace width wl), and trace separation distance (trace separation h) have a relationship defined in Equation (1). The target design value for the impedance $Z_0$ is treated as a constant and the trace thickness t, trace width w, and trace separation h are varied to determine a set of optimized values thereof. Such optimization is directed toward facilitating proper operation of modern PCIe above version 4.0, i.e., PCEe 5.0 and 6.0. Specifically, the implementation of proper impedance matching between the vertical signal trace, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

According to an aspect of the disclosure, the VeCS is a single-ended VeCS.

In embodiments, a single-ended VeCS configuration includes a single trace that extends from a source to a routed destination. The single-ended VeCS configuration is the most cost-efficient option to implement because fewer wires are required for transmitting multiple signals. Therefore, since the single-ended VeCS configuration is a popular configuration, PCBs that use single-ended VeCSs will benefit from the improved performance over that of known VeCSs.

According to an aspect of the disclosure, the predetermined impedance of the single-ended VeCS is related to a thickness of the vertical signal trace, a width of the vertical signal trace, and a separation distance between the vertical signal trace and the vertical reference trace. Also, the predetermined impedance of the single-ended VeCS has a target value. Further, the thickness of the vertical signal trace, the width of the vertical signal trace, and the separation distance between the vertical signal trace and the vertical reference trace are configured to achieve the target value of the impedance of the single-ended VeCS.

In embodiments, the thickness of the vertical signal trace (trace thickness t), width of the vertical signal trace (trace width w), and trace separation distance (trace separation h) have a relationship defined in Equation (1). The target design value for the impedance $Z_0$ is treated as a constant and the trace thickness t, trace width w, and trace separation h are varied to determine a set of optimized values thereof. Such optimization is directed toward facilitating proper operation of modern PCIe above version 4.0, i.e., PCEe 5.0 and 6.0. Specifically, the implementation of proper impedance matching between the vertical signal trace, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

According to an aspect of the disclosure, the VeCS is a differential VeCS and the vertical signal trace is a first vertical signal trace. The VeCS further includes a second vertical signal trace positioned on the first side of the VeCS slot. The first and second vertical signal traces are separated by a signal trace separation distance, and the first and second vertical signal traces have similar widths and thicknesses.

In embodiments, as contrasted to the single-ended VeCs, a differential VeCS configuration includes two complementary signals, each with its own trace. While the differential signal configuration is more costly since there are two signal traces, the differential VeCS configuration provides for more stable data transfer when electromagnetic interference (EMI) and radiofrequency interference (RFI) are expected and the resultant noise is not tolerable for the intended use through other configurations.

According to an aspect of the disclosure, the differential VeCS has an impedance that is related to the thicknesses of the first and second vertical signal trace, the widths of the first and second vertical signal trace, the separation distance between the first and second vertical signal traces and the vertical reference trace, and the signal trace separation distance. The impedance of the differential VeCS has a target value. The thickness of the first and second vertical signal traces, the width of the first and second vertical signal traces, the separation distance between the first and second vertical signal traces and the vertical reference trace, and the signal trace separation distance are configured to achieve the target value of the impedance of the differential VeCS.

In embodiments, the thickness of the vertical signal traces (trace thickness t), width of the vertical signal traces (trace width w), separation distance (trace separation h), and signal trace separation distance (signal trace separation s) have a relationship defined in Equation (3). The target design value for the impedance $Z_{diff}$ is treated as a constant and the trace thickness t, trace width w, trace separation h, and signal trace separation s are varied to determine a set of optimized values thereof. Such optimization is directed toward facilitating proper operation of modern PCIe above version 4.0, i.e., PCEe 5.0 and 6.0. Specifically, the implementation of proper impedance matching between the vertical signal traces, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

According to an aspect of the disclosure, the VeCS slot is filled with air separating the vertical signal trace and the vertical reference trace.

In embodiments, the employment of air in the VeCS slot is economically advantageous as compared to other fills, and is technically simple.

According to an aspect of the disclosure, the VeCS slot is filled with a dielectric fill separating the vertical signal trace and the vertical reference trace.

In embodiments, the dielectric fill facilitates impedance matching within the VeCS embodiments presented herein. Many candidates for the dielectric fill include a dielectric constant that exceeds unity (1) (e.g., the approximate value for air). The value of the unitless dielectric constant of the material of the plated vertical signal trace (typically copper) and the air (typically approximately unity) in the VeCS slot, i.e., $\varepsilon_r$ of equations (1) and (3), is altered by the addition of the dielectric fill other than air. Accordingly, the use of the dielectric fill could alter the value of $Z_0$ that represents the characteristic impedance of the single-ended VeCS (see equation (1)) and the value of $Z_{diff}$ that represents the characteristic impedance of the differential VeCS (see equation (3)). In some embodiments, the flexibility to adjust the overall impedance of the VeCS configurations facilitates designing and fabricating a wider range of PCBs. For example, the trace separation h, the trace thickness t, the trace width w, and the signal trace separation s (for the differential VeCS embodiments) may be altered in conjunction with the dielectric constant to maintain the value of 50Ω for the single-ended VeCS configurations and maintain 85Ω for the differential VeCS configurations. For example, and without limitation, fabrication of the VeCSs described herein with a dielectric fill that has a dielectric constant $\varepsilon_r$ greater than that of air (typically approximately unity) provides opportunities for smaller values for the trace width w and the trace thickness t, as well as larger values for the trace separation h and the signal trace separation s.

According to an aspect of the disclosure, a vertical conductive structure (VeCS) for a printed circuit board (PCB) is presented. The VeCS includes a VeCS slot at least partially defined in a dielectric substrate. The VeCS also includes a vertical signal trace positioned within the VeCS slot. The VeCS further incudes a plurality of signal ground planes. Each signal ground plane of the plurality of signal ground planes is positioned at a respective predetermined distance from the vertical signal trace, and each signal ground plane of the plurality of signal ground planes defines a cutout.

In embodiments, the purpose of the separation distance is to mitigate a potential for electrical discontinuities of the plated vertical signal trace due to a signal GND plane shorting the plated vertical signal trace to ground. Therefore, those signal GND planes that extend towards the plated vertical signal trace are fabricated to only extend to a predetermined distance from the plated vertical signal trace. Also, in embodiments, no portion of the signal ground planes will be closer to the plated vertical signal trace than the respective separation distance, thereby mitigating a potential for a short circuit condition between the respective signal ground plane and the plated vertical signal trace. In addition, the signal ground plane is sufficiently large to most effectively provide the ground potential proximate the plated vertical signal trace.

According to an aspect of the disclosure, a first signal ground plane of the plurality of signal ground planes is positioned a first separation distance from the vertical signal trace. In addition, a second signal ground plane of the plurality of signal ground planes is positioned a second separation distance from the vertical signal trace. The second separation distance is greater than the first separation distance.

In embodiments, approximately 50 to 70 mils for first separation distance and the first signal ground plane facilitates mitigating any risk of a short circuit condition between the signal GND plane and the plated vertical signal trace. In addition, extending the first signal ground plane parallel to the upper horizontal signal trace layer out to approximately 50 to 70 mils from the plated vertical signal trace provides a horizontal length sufficient to mitigate a potential for developing any reference gaps under the upper horizontal signal trace layer. The formation of reference gaps increases the potential for electrical discontinuities along the upper horizontal signal trace layer. As such, the first signal ground layer provides the desired ground reference to the upper horizontal signal trace layer to facilitate proper voltage thereon and facilitate proper current for uninterrupted data transmission therethrough. Also, in embodiments, the second separation distance is at least approximately 100 to 120 mils. The second separation distance exceeds the approximately 50 to 70 mil value of the first separation distance since the second signal ground plane is not proximate either of the upper horizontal signal trace layer and the lower horizontal signal trace layer. Therefore, the mitigation of a risk of reference gaps under the upper horizontal signal trace layer and under the lower horizontal signal trace layer is not as important with respect to the second signal ground plane as that associated with the first signal ground plane. Therefore, the greater distance of the of the second separation distance provides a greater margin of mitigating a short circuit risk with the plated vertical signal trace.

According to an aspect of the disclosure, the VeCS further includes an upper horizontal signal trace layer electrically coupled to the vertical signal trace, and a lower horizontal signal trace layer electrically coupled to the vertical signal trace.

In embodiments, the upper horizontal signal trace layer, the vertical signal trace, and the lower horizontal signal trace layer define a signal transmission path through the VeCS.

According to an aspect of the disclosure, the first signal ground plane parallels the upper horizontal signal trace layer.

In embodiments, extending the first signal ground plane parallel to the upper horizontal signal trace layer mitigates a potential for developing any reference gaps under the upper horizontal signal trace layer. The formation of reference gaps increases the potential for electrical discontinuities along the upper horizontal signal trace layer. As such, the first signal ground layer provides the desired ground reference to the upper horizontal signal trace layer to facilitate proper voltage thereon and facilitate proper current for uninterrupted data transmission therethrough.

According to an aspect of the disclosure, the VeCS further includes a third signal ground plane of the plurality of signal ground planes that is positioned below the lower horizontal signal trace layer. The third signal ground plane extends proximate the VeCS slot.

In embodiments, the lowermost signal ground plane extends to the first PCB sidewall and there is no associated separation distance. The lowermost signal ground plane is positioned within the PCB substrate below the lower horizontal signal trace layer. As such, the plated vertical signal trace ends at the junction with the lower horizontal trace layer and does not extend to the bottom of the VeCS slot. The potential for electrical discontinuities of the plated vertical signal trace due to the lowermost signal ground plane shorting the plated vertical signal trace to ground are minimal. The lowermost signal ground plane is parallel to the lower horizontal signal trace layer to mitigate a potential for developing any reference gaps under the lower horizontal signal trace layer. The formation of reference gaps increases the potential for electrical discontinuities along the lower horizontal signal trace layer. As such, the lowermost signal ground layer provides the desired ground reference to the lower horizontal signal trace layer to facilitate proper voltage thereon and facilitate proper current for uninterrupted data transmission therethrough.

According to an aspect of the disclosure, a printed circuit board (PCB) is presented. The PCB includes a plurality of vertical conductive structures (VeCSs). One or more VeCSs of the plurality of VeCSs includes a VeCS slot at least partially defined in a dielectric substrate. Such VeCSs also include a vertical signal trace positioned on a first side of the VeCS slot. The VeCSs further include a vertical reference trace positioned on a second side of the VeCS slot opposite the vertical signal trace.

In embodiments, the VeCS facilitates the improvement of the overall signal integrity of the PCB through adding a reference plane in the form of the vertical reference trace to the VeCS. The vertical reference trace is typically maintained at ground potential. The plated metal solid reference opposite the vertical signal trace(s) creates a quasi-microstrip vertical configuration and facilitates reducing any potential for discontinuities of the plated vertical signal trace. In addition, the vertical reference trace mitigates a potential for errant signals interfering with other traces and inducing antenna-like behavior in portions of the PCB that increases noise levels on the PCB.

According to an aspect of the disclosure, the VeCS has a predetermined impedance.

In embodiments, the thickness of the vertical signal trace (trace thickness t), width of the vertical signal trace (trace width w), and trace separation distance (trace separation h) have a relationship defined in Equation (1). The target design value for the impedance $Z_0$ is treated as a constant and the trace thickness t, trace width w, and trace separation h are varied to determine a set of optimized values thereof. Such optimization is directed toward facilitating proper operation of modern PCIe above version 4.0, i.e., PCEe 5.0 and 6.0. Specifically, the implementation of proper impedance matching between the vertical signal trace, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

According to an aspect of the disclosure, the PCB further includes a plurality of signal ground planes, Each signal ground plane of the plurality of signal ground planes is positioned at a respective predetermined distance from the vertical signal trace, and each signal ground plane of the plurality of signal ground planes defines a cutout.

In embodiments, the purpose of the separation distance is to mitigate a potential for electrical discontinuities of the plated vertical signal trace due to a signal GND plane shorting the plated vertical signal trace to ground. Therefore, those signal GND planes that extend towards the plated vertical signal trace are fabricated to only extend to a predetermined distance from the plated vertical signal trace. Also, in embodiments, no portion of the signal ground planes will be closer to the plated vertical signal trace than the respective separation distance, thereby mitigating a potential for a short circuit condition between the respective signal ground plane and the plated vertical signal trace. In addition, the signal ground plane is sufficiently large to most effectively provide the ground potential proximate the plated vertical signal trace.

According to an aspect of the disclosure, a method of fabricating a printed circuit board (PCB) is provided. The method includes fabricating a vertical conductive structure (VeCS). Such fabrication of the VeCS includes forming a VeCS slot in a dielectric substrate. The VeCS slot defines a first side of the VeCS slot and an opposing second side of the VeCS slot. The method also includes positioning a vertical signal trace on the first side of the VeCS slot. The method further includes positioning a vertical reference trace on the second side of the VeCS slot. The VeCS has a predetermined impedance.

In embodiments, the thickness of the vertical signal trace (trace thickness t), width of the vertical signal trace (trace width wl), and trace separation distance (trace separation h) have a relationship defined in Equation (1). The target design value for the impedance $Z_0$ is treated as a constant and the trace thickness t, trace width w, and trace separation h are varied to determine a set of optimized values thereof. Such optimization is directed toward facilitating proper operation of modern PCIe above version 4.0, i.e., PCEe 5.0 and 6.0. Specifically, the implementation of proper impedance matching between the vertical signal trace, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

According to an aspect of the disclosure, the method further includes determining values for a thickness of the vertical signal trace, a width of the vertical signal trace, and a trace separation distance between the vertical signal trace and the vertical reference trace, wherein such values are at least partially dependent on the predetermined impedance.

In embodiments, the thickness of the vertical signal trace (trace thickness t), width of the vertical signal trace (trace width w), and trace separation distance (trace separation h) have a relationship defined in Equation (1). The target design value for the impedance $Z_0$ is treated as a constant and the trace thickness t, trace width w, and trace separation h are varied to determine a set of optimized values thereof. Such optimization is directed toward facilitating proper operation of modern PCIe above version 4.0, i.e., PCEe 5.0 and 6.0. Specifically, the implementation of proper impedance matching between the vertical signal trace, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

According to an aspect of the disclosure, the method further includes determining values for a width of the VeCS slot and a length of the VeCS slot.

In embodiments, the width and length dimensions of the VeCS slot are determined at the design phase to facilitate successful fabrication of the respective VeCSs and PCBs.

According to an aspect of the disclosure, the method also includes electrically coupling an upper horizontal signal trace layer to the vertical signal trace and electrically coupling a lower horizontal signal trace layer to the vertical signal trace. The method further includes positioning a first signal ground plane of the plurality of signal ground planes a first separation distance from the vertical signal trace. The first signal ground plane parallels the upper horizontal signal trace layer. The method also includes positioning a second signal ground plane of the plurality of signal ground planes a second separation distance from the vertical signal trace. The second separation distance is greater than the first separation distance. The method further includes positioning a third signal ground plane of the plurality of signal ground planes below the lower horizontal signal trace layer. The third signal ground plane extends proximate the VeCS slot.

In embodiments, the upper horizontal signal trace layer, the vertical signal trace, and the lower horizontal signal trace layer define a signal transmission path through the VeCS. Also, in embodiments, approximately 50 to 70 mils for first separation distance and the first signal ground plane facilitates mitigating any risk of a short circuit condition between the signal GND plane and the plated vertical signal trace. In addition, extending the first signal ground plane parallel to the upper horizontal signal trace layer out to approximately 50 to 70 mils from the plated vertical signal trace provides a horizontal length sufficient to mitigate a potential for developing any reference gaps under the upper horizontal signal trace layer. The formation of reference gaps increases the potential for electrical discontinuities along the upper horizontal signal trace layer. As such, the first signal ground layer provides the desired ground reference to the upper horizontal signal trace layer to facilitate proper voltage thereon and facilitate proper current for uninterrupted data transmission therethrough.

Also, in embodiments, the second separation distance is at least approximately 100 to 120 mils. The second separation distance exceeds the approximately 50 to 70 mil value of the first separation distance since the second signal ground plane is not proximate either of the upper horizontal signal trace layer and the lower horizontal signal trace layer. Therefore, the mitigation of a risk of reference gaps under the upper horizontal signal trace layer and under the lower horizontal signal trace layer is not as important with respect to the second signal ground plane as that associated with the first signal ground plane. Therefore, the greater distance of the of the second separation distance provides a greater margin of mitigating a short circuit risk with the plated vertical signal trace. Further, in embodiments, extending the first signal ground plane parallel to the upper horizontal signal trace layer mitigates a potential for developing any reference gaps under the upper horizontal signal trace layer. The formation of reference gaps increases the potential for electrical discontinuities along the upper horizontal signal trace layer. As such, the first signal ground layer provides the desired ground reference to the upper horizontal signal trace layer to facilitate proper voltage thereon and facilitate proper current for uninterrupted data transmission therethrough.

Moreover, in embodiments, the lowermost signal ground plane extends to the first PCB sidewall and there is no associated separation distance. The lowermost signal ground plane is positioned within the PCB substrate below the lower horizontal signal trace layer. As such, the plated vertical signal trace ends at the junction with the lower horizontal trace layer and does not extend to the bottom of the VeCS slot. The potential for electrical discontinuities of the plated vertical signal trace due to the lowermost signal ground plane shorting the plated vertical signal trace to ground are minimal. The lowermost signal ground plane is parallel to the lower horizontal signal trace layer to mitigate a potential for developing any reference gaps under the lower horizontal signal trace layer. The formation of reference gaps increases the potential for electrical discontinuities along the lower horizontal signal trace layer. As such, the lowermost signal ground layer provides the desired ground reference to the lower horizontal signal trace layer to facilitate proper voltage thereon and facilitate proper current for uninterrupted data transmission therethrough.

According to an aspect of the disclosure, the vertical reference trace is planar and the VeCS slot is substantially rectangular.

In embodiments, the planar vertical reference trace eliminates the rounded segments of the reference planes in some known VeCSs, thereby eliminating any deleterious reflections at the higher signal speeds and enhancing the signal integrity and mitigating field distortions. The substantially rectangular configuration of the VeCS slot facilitates the positioning of the vertical reference trace within the VeCS slot.

According to an aspect of the disclosure, a vertical conductive structure (VeCS) for a printed circuit board (PCB) is presented. The VeCS includes a VeCS slot at least partially defined in a dielectric substrate. The VeCS also includes a vertical signal trace positioned on a first side of the VeCS slot. The VeCS further includes a vertical reference trace positioned on a second side of the VeCS slot opposite the vertical signal trace, wherein the vertical reference trace is planar.

A particular application of an embodiment of the present disclosure includes using the VeCS configurations described by FIGS. 1A-1C, 2, and 3A to replace vias and microvias during fabrication of a printed circuit board (PCB). The configuration of the VeCS slot as formed in the PCB substrate from an overhead perspective is substantially rectangular, which facilitates the second side of the VeCS slot, i.e., the second PCB sidewall receiving the planar plated vertical reference trace directly opposite the vertical signal trace positioned on the first PCB sidewall. The planar vertical reference trace advantageously eliminates the rounded segments of the reference planes in some known VeCSs, thereby eliminating any deleterious reflections at the higher signal speeds and enhancing the signal integrity and mitigating field distortions.

According to an aspect of the disclosure, a single-ended vertical conductive structure (VeCS) for a printed circuit board (PCB) is presented. The single-ended VeCS includes a VeCS slot at least partially defined in a dielectric substrate. The single-ended VeCS also includes a vertical signal trace positioned on a first side of the VeCS slot. The single-ended VeCS further includes a vertical reference trace positioned on a second side of the VeCS slot opposite the vertical signal trace, wherein the VeCS has a predetermined impedance. The predetermined impedance of the single-ended VeCS is related to a thickness of the vertical signal trace, a width of the vertical signal trace, and a separation distance between the vertical signal trace and the vertical reference trace. The impedance of the single-ended VeCS has a target value. The thickness of the vertical signal trace, the width of the vertical signal trace, and the separation distance between the vertical signal trace and the vertical reference trace are configured to achieve the target value of the impedance of the single-ended VeCS.

A particular application of an embodiment of the present disclosure includes using the VeCS configurations described by FIGS. 1A-1C, 2, and 3A including a single-ended VeCS configuration that includes a single trace that extends from a source to a routed destination. The single-ended VeCS configuration is the most cost-efficient option to implement because fewer wires are required for transmitting multiple signals. Therefore, since the single-ended VeCS configuration is a popular configuration, PCBs that use single-ended VeCSs will benefit from the improved performance over that of known VeCSs. The thickness of the vertical signal trace (trace thickness t), width of the vertical signal trace (trace width w), and trace separation distance (trace separation h) have a relationship defined in Equation (1). The target design value for the impedance $Z_0$ is treated as a constant and the trace thickness t, trace width w, and trace separation h are varied to determine a set of optimized values thereof. Such optimization is directed toward facilitating proper operation of modern PCIe above version 4.0, i.e., PCIe 5.0 and 6.0. Specifically, the implementation of proper impedance matching between the vertical signal trace, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

According to an aspect of the disclosure, a differential vertical conductive structure (VeCS) for a printed circuit board (PCB) is presented. The VeCS includes a VeCS slot at least partially defined in a dielectric substrate. The VeCS also concludes a first vertical signal trace positioned on a first side of the VeCS slot. The VeCS further includes a second vertical signal trace positioned on the first side of the VeCS slot. The first and second vertical signal traces are separated by a signal trace separation distance. The first and second vertical signal traces have similar widths and thicknesses. The VeCS also includes a vertical reference trace positioned on a second side of the VeCS slot opposite the vertical signal trace. The VeCS has a predetermined impedance. The differential VeCS has an impedance that is related to the thicknesses of the first and second vertical signal trace, the widths of the first and second vertical signal trace, the separation distance between the first and second vertical signal traces and the vertical reference trace, and the signal trace separation distance. The impedance of the differential VeCS has a target value. The thickness of the first and second vertical signal traces, the width of the first and second vertical signal traces, the separation distance between the first and second vertical signal traces and the vertical reference trace, and the signal trace separation distance are configured to achieve the target value of the impedance of the differential VeCS.

A particular application of an embodiment of the present disclosure includes using the VeCS configurations described by FIGS. 1A-1C, and 2, including a differential VeCS configuration that includes two complementary signals, each with its own trace. While the differential signal configuration is more costly since there are two signal traces, the differential VeCS configuration provides for more stable data transfer when electromagnetic interference (EMI) and radiofrequency interference (RFI) are expected and the resultant noise is not tolerable for the intended use through other configurations. PCBs that use differential VeCSs will benefit from the improved performance over that of known VeCSs. The thickness of the vertical signal traces (trace thickness t), width of the vertical signal traces (trace width w), separation distance (trace separation h), and signal trace separation distance (signal trace separation s) have a relationship defined in Equation (3). The target design value for the impedance $Z_{diff}$ is treated as a constant and the trace thickness t, trace width w, trace separation h, and signal trace separation s are varied to determine a set of optimized values thereof. Such optimization is directed toward facilitating proper operation of modern PCIe above version 4.0, i.e., PCIe 5.0 and 6.0. Specifically, the implementation of proper impedance matching between the vertical signal traces, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane.

According to an aspect of the disclosure, a vertical conductive structure (VeCS) for a printed circuit board (PCB) is presented. The VeCS includes a VeCS slot at least partially defined in a dielectric substrate and a vertical signal trace positioned within the VeCS slot. The VeCS also includes an upper horizontal signal trace layer electrically coupled to the vertical signal trace and a lower horizontal signal trace layer electrically coupled to the vertical signal trace. The VeCS further includes a plurality of signal ground planes. Each signal ground plane of the plurality of signal ground planes is positioned at a respective predetermined distance from the vertical signal trace, and each signal ground plane of the plurality of signal ground planes defines a cutout. A first signal ground plane of the plurality of signal ground planes is positioned a first separation distance from the vertical signal trace. The first signal ground plane parallels the upper horizontal signal trace layer. A second signal ground plane of the plurality of signal ground planes is positioned a second separation distance from the vertical signal trace. The second separation distance is greater than the first separation distance. A third signal ground plane of the plurality of signal ground planes is positioned below the lower horizontal signal trace layer. The third signal ground plane extends proximate the VeCS slot.

A particular application of an embodiment of the present disclosure includes using the VeCS configurations described by FIGS. 3A and 3B. The separation distance is configured to mitigate a potential for electrical discontinuities of the plated vertical signal trace due to a signal GND plane shorting the plated vertical signal trace to ground. Therefore, those signal GND planes that extend towards the plated vertical signal trace are fabricated to only extend to a predetermined distance from the plated vertical signal trace. No portion of the signal ground planes will be closer to the plated vertical signal trace than the respective separation distance, thereby mitigating the potential for a short circuit condition between the respective signal ground plane and the plated vertical signal trace. The signal ground plane is sufficiently large to most effectively provide the ground potential proximate the plated vertical signal trace. In addition, extending the first signal ground plane parallel to the upper horizontal signal trace layer out to approximately 50 to 70 mils from the plated vertical signal trace provides a horizontal length sufficient to mitigate a potential for developing any reference gaps under the upper horizontal signal trace layer. The formation of reference gaps increases the potential for electrical discontinuities along the upper horizontal signal trace layer. As such, the first signal ground layer provides the desired ground reference to the upper horizontal signal trace layer to facilitate proper voltage thereon and facilitate proper current for uninterrupted data transmission therethrough.

Moreover, extending the first signal ground plane parallel to the upper horizontal signal trace layer mitigates a potential for developing any reference gaps under the upper horizontal signal trace layer. The formation of reference gaps increases the potential for electrical discontinuities along the upper horizontal signal trace layer. As such, the first signal ground layer provides the desired ground reference to the upper horizontal signal trace layer to facilitate proper voltage thereon and facilitate proper current for uninterrupted data transmission therethrough. Furthermore, the second separation distance is at least approximately 100 to 120 mils. The second separation distance exceeds the approximately 50 to 70 mil value of the first separation distance since the second signal ground plane is not proximate either of the upper horizontal signal trace layer and the lower horizontal signal trace layer. Therefore, the mitigation of a risk of reference gaps under the upper horizontal signal trace layer and under the lower horizontal signal trace layer is not as important with respect to the second signal ground plane as that associated with the first signal ground plane. Therefore, the greater distance of the of the second separation distance provides a greater margin of mitigating a short circuit risk with the plated vertical signal trace.

In addition, the lowermost signal ground plane extends to the first PCB sidewall and there is no associated separation distance. The lowermost signal ground plane is positioned within the PCB substrate below the lower horizontal signal trace layer. As such, the plated vertical signal trace ends at the junction with the lower horizontal trace layer and does not extend to the bottom of the VeCS slot. The potential for electrical discontinuities of the plated vertical signal trace due to the lowermost signal ground plane shorting the plated vertical signal trace to ground are minimal. The lowermost signal ground plane is parallel to the lower horizontal signal trace layer to mitigate a potential for developing any reference gaps under the lower horizontal signal trace layer. The formation of reference gaps increases the potential for electrical discontinuities along the lower horizontal signal trace layer. As such, the lowermost signal ground layer provides the desired ground reference to the lower horizontal signal trace layer to facilitate proper voltage thereon and facilitate proper current for uninterrupted data transmission therethrough.

According to an aspect of the disclosure, a method of fabricating a printed circuit board (PCB) is presented. The method includes fabricating an impedance-controlled vertical conductive structure (VeCS). Such fabrication includes forming a VeCS slot in a dielectric substrate. The VeCS slot defines a first side of the VeCS slot and an opposing second side of the VeCS slot. The fabrication of the VeCS slot also includes positioning a vertical signal trace on the first side of the VeCS slot. The fabrication of the VeCS slot further includes positioning a vertical reference trace on the second side of the VeCS slot. The VeCS has a predetermined impedance. The method of fabricating the PCB also includes determining values for a thickness of the vertical signal trace, a width of the vertical signal trace, and a trace separation distance between the vertical signal trace and the vertical reference trace. Such values are at least partially dependent on the predetermined impedance. The method of fabricating the PCB further includes determining values for a width of the VeCS slot and a length of the VeCS slot.

A particular application of an embodiment of the present disclosure includes determining the thickness of the vertical signal trace (trace thickness t), width of the vertical signal trace (trace width wl), and trace separation distance (trace separation h) that have a relationship defined in Equation (1). The target design value for the impedance $Z_0$ is treated as a constant and the trace thickness t, trace width w, and trace separation h are varied to determine a set of optimized values thereof. Such optimization is directed toward facilitating proper operation of modern PCIe above version 4.0, i.e., PCEe 5.0 and 6.0. Specifically, the implementation of proper impedance matching between the vertical signal trace, the fill of the VeCS slot, and the vertical reference trace, facilitates mitigation of signal reflection in the VeCSs in high-speed PCB data circuits that will enhance the signal integrity in the PCBs. More specifically, the performance of the enhanced PCBs will not suffer decreasing performance for signal speeds (transfer rates) in excess of 16.0 gigatransfers per second (GT/s) per lane. In embodiments, the width and length dimensions of the VeCS slot are determined at the design phase to facilitate successful fabrication of the respective VeCSs and PCBs. The values of the trace separation h, the trace thickness t, and the trace width w are used to at least partially determine the dimensions of the VeCS slot 102, including the VeCS slot width 112 and the VeCS slot length 111 that are manufacturable through the software tools previously identified. While the above discussion is directed toward single-ended VeCS configurations, similar considerations are used with differential VeCSs as discussed herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical conductive structure (VeCS) for a printed circuit board (PCB), comprising:
a VeCS slot at least partially defined in a dielectric substrate, wherein the VeCS is a single-ended VeCS;
a vertical signal trace positioned on a first side of the VeCS slot; and
a vertical reference trace positioned on a second side of the VeCS slot opposite the vertical signal trace.

2. The VeCS of claim 1, wherein:
the vertical reference trace is planar.

3. The VeCS of claim 1, further comprising:
one or more reference ground planes electrically coupled to the vertical reference trace.

4. A printed circuit board (PCB), comprising:
a plurality of vertical conductive structures (VeCSs), wherein one or more VeCSs of the plurality of VeCSs comprising:
a VeCS slot at least partially defined in a dielectric substrate;
a vertical signal trace positioned on a first side of the VeCS slot;
a vertical reference trace positioned on a second side of the VeCS slot opposite the vertical signal trace; and
a plurality of signal ground planes, wherein each signal ground plane of the plurality of signal ground planes is positioned at a respective predetermined distance from the vertical signal trace, and each signal ground plane of the plurality of signal ground planes defines a cutout.

5. The PCB of claim 4, wherein:
the VeCS has a predetermined impedance.

6. A vertical conductive structure (VeCS) for a printed circuit board (PCB), comprising:
a VeCS slot at least partially defined in a dielectric substrate, wherein the VeCS is a differential VeCS and a vertical signal trace is a first vertical signal trace;
the vertical signal trace positioned on a first side of the VeCS slot;
a vertical reference trace positioned on a second side of the VeCS slot opposite the vertical signal trace, wherein the VeCS has a predetermined impedance; and
a second vertical signal trace positioned on the first side of the VeCS slot, the first and second vertical signal traces are separated by a signal trace separation distance, and the first and second vertical signal traces have similar widths and thicknesses.

7. The VeCS of claim 6, wherein:
the differential VeCS has an impedance that is related to the thicknesses of the first and second vertical signal trace, the widths of the first and second vertical signal trace, a separation distance between the first and second vertical signal traces and the vertical reference trace, and the signal trace separation distance;
the impedance of the differential VeCS has a target value; and
the thickness of the first and second vertical signal traces, the width of the first and second vertical signal traces, the separation distance between the first and second vertical signal traces and the vertical reference trace, and the signal trace separation distance are configured to achieve the target value of the impedance of the differential VeCS.

8. The VeCS of claim 6, wherein:
the VeCS slot is filled with air separating the vertical signal trace and the vertical reference trace.

9. The VeCS of claim 6, wherein:
the VeCS slot is filled with a dielectric fill separating the vertical signal trace and the vertical reference trace.

10. A vertical conductive structure (VeCS) for a printed circuit board (PCB), comprising:
a VeCS slot at least partially defined in a dielectric substrate;
a vertical signal trace positioned within the VeCS slot; and
a plurality of signal ground planes, wherein each signal ground plane of the plurality of signal ground planes is positioned at a respective predetermined distance from the vertical signal trace, and each signal ground plane of the plurality of signal ground planes defines a cutout.

11. The VeCS of claim 10, wherein:
a first signal ground plane of the plurality of signal ground planes is positioned a first separation distance from the vertical signal trace; and
a second signal ground plane of the plurality of signal ground planes is positioned a second separation distance from the vertical signal trace, wherein the second separation distance is greater than the first separation distance.

12. The VeCS of claim 11, further comprising:
an upper horizontal signal trace layer electrically coupled to the vertical signal trace; and
a lower horizontal signal trace layer electrically coupled to the vertical signal trace.

13. The VeCS of claim 12, wherein:
the first signal ground plane parallels the upper horizontal signal trace layer.

14. The VeCS of claim 12, further comprising:
a third signal ground plane of the plurality of signal ground planes is positioned below the lower horizontal signal trace layer, wherein the third signal ground plane extends proximate the VeCS slot.

15. A method of fabricating a printed circuit board (PCB), comprising:
fabricating an impedance-controlled vertical conductive structure (VeCS), comprising:
forming a VeCS slot in a dielectric substrate, wherein the VeCS slot defines a first side of the VeCS slot and an opposing second side of the VeCS slot, and the VeCS is a single-ended VeCS;
positioning a vertical signal trace on the first side of the VeCS slot; and
positioning a vertical reference trace on the second side of the VeCS slot, wherein the VeCS has a predetermined impedance.

16. The method of claim 15, further comprising:
determining values for a thickness of the vertical signal trace, a width of the vertical signal trace, and a trace separation distance between the vertical signal trace and the vertical reference trace, wherein such values are at least partially dependent on the predetermined impedance.

17. The method of claim 16, further comprising:

determining values for a width of the VeCS slot and a length of the VeCS slot.

18. The method of claim 15, further comprising:

electrically coupling an upper horizontal signal trace layer to the vertical signal trace;

electrically coupling a lower horizontal signal trace layer to the vertical signal trace;

positioning a first signal ground plane of a plurality of signal ground planes a first separation distance from the vertical signal trace, wherein the first signal ground plane parallels the upper horizontal signal trace layer;

positioning a second signal ground plane of the plurality of signal ground planes a second separation distance from the vertical signal trace, wherein the second separation distance is greater than the first separation distance; and positioning a third signal ground plane of the plurality of signal ground planes below the lower horizontal signal trace layer, wherein the third signal ground plane extends proximate the VeCS slot.

19. The method of claim 15, wherein:

the vertical reference trace is planar; and the VeCS slot is substantially rectangular.

\* \* \* \* \*